US 6,514,794 B2

(12) United States Patent
Haba et al.

(10) Patent No.: US 6,514,794 B2
(45) Date of Patent: Feb. 4, 2003

(54) REDISTRIBUTED BOND PADS IN STACKED INTEGRATED CIRCUIT DIE PACKAGE

(75) Inventors: Belgacem Haba, Cupertino, CA (US); Donald V. Perino, North Potomac, MD (US); Sayeh Khalili, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/072,412

(22) Filed: Feb. 5, 2002

(65) Prior Publication Data

US 2002/0127775 A1 Sep. 12, 2002

Related U.S. Application Data

(60) Division of application No. 09/685,941, filed on Oct. 10, 2000, now Pat. No. 6,376,904, which is a continuation-in-part of application No. 09/471,304, filed on Dec. 23, 1999.

(51) Int. Cl.[7] .......................... H01L 21/44; H01L 21/48; H01L 21/50
(52) U.S. Cl. ..................... 438/109; 438/107; 438/125; 438/455
(58) Field of Search ................................. 438/107, 109, 438/125, 455

(56) References Cited

U.S. PATENT DOCUMENTS 4,879,588 A * 11/1989 Ohtsuka et al.
5,703,436 A * 12/1997 Forrest et al. ............... 313/506
5,777,345 A *  7/1998 Loder et al. ................. 257/777
5,804,004 A *  9/1998 Tyckerman et al. ........... 156/60
5,998,864 A * 12/1999 Khandros et al. ........... 257/723
6,005,778 A * 12/1999 Spielberger et al. ........ 257/686
6,072,700 A *  6/2000 Nam ........................... 257/777
6,093,969 A *  7/2000 Lin ............................. 257/777
6,133,629 A * 10/2000 Han et al. ................... 257/723
6,180,881 B1 *  1/2001 Isaak .......................... 257/686
6,181,002 B1 *  1/2001 Juso et al. ................... 257/686
6,215,182 B1 *  4/2001 Ozawa et al. ................ 257/723
6,229,217 B1 *  5/2001 Fukui et al. ................. 257/777

* cited by examiner

Primary Examiner—Kamand Cuneo
Assistant Examiner—David A. Zarneke
(74) Attorney, Agent, or Firm—Pennie & Edmonds LLP

(57) ABSTRACT

A semiconductor module having a first integrated circuit die having a planar surface. The first integrated circuit die has a first conductive pad disposed substantially on the planar surface and a redistributed conductive pad electrically connected to the first conductive pad. The redistributed conductive pad is disposed near a periphery of the planar surface. The semiconductor module has a second integrated circuit die stacked adjacent to the planar surface and offset from the periphery, such that a second conductive pad on the second integrated circuit die can be electrically connected to the redistributed conductive pad.

18 Claims, 17 Drawing Sheets

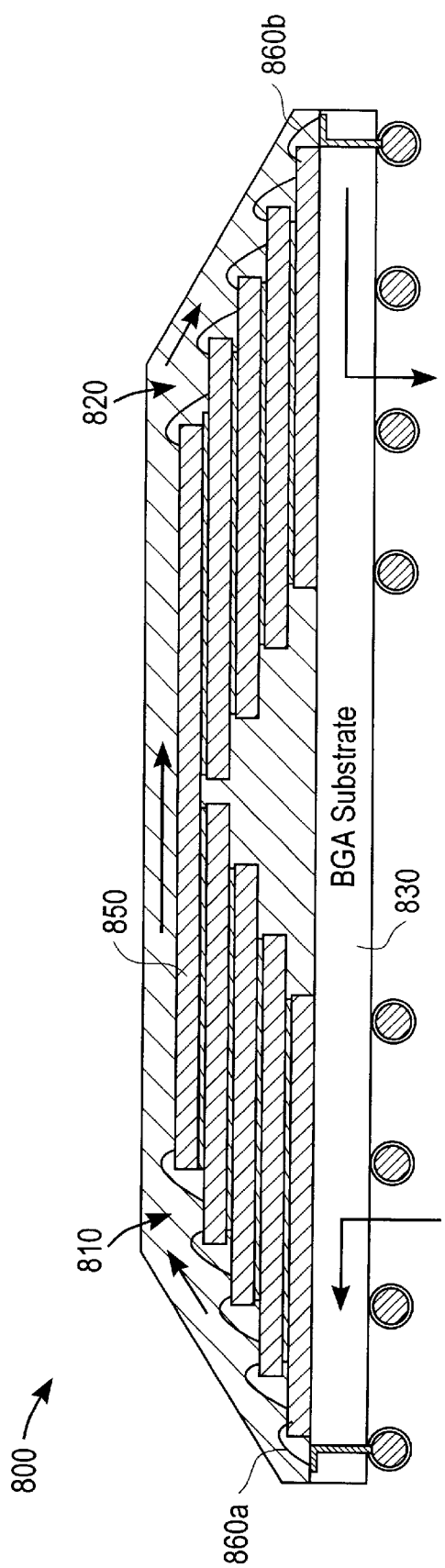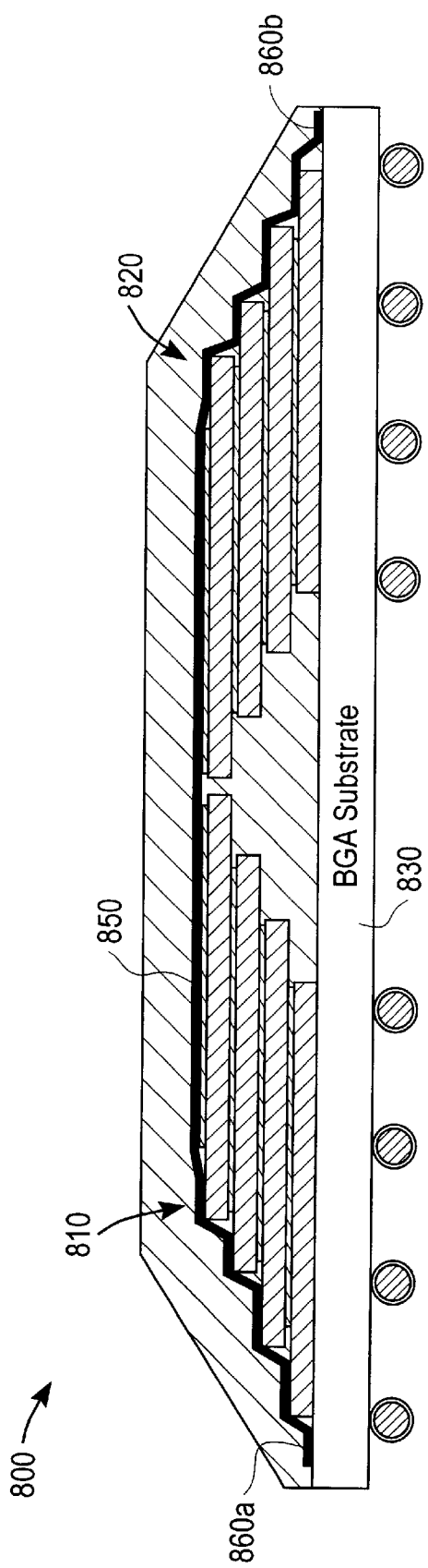

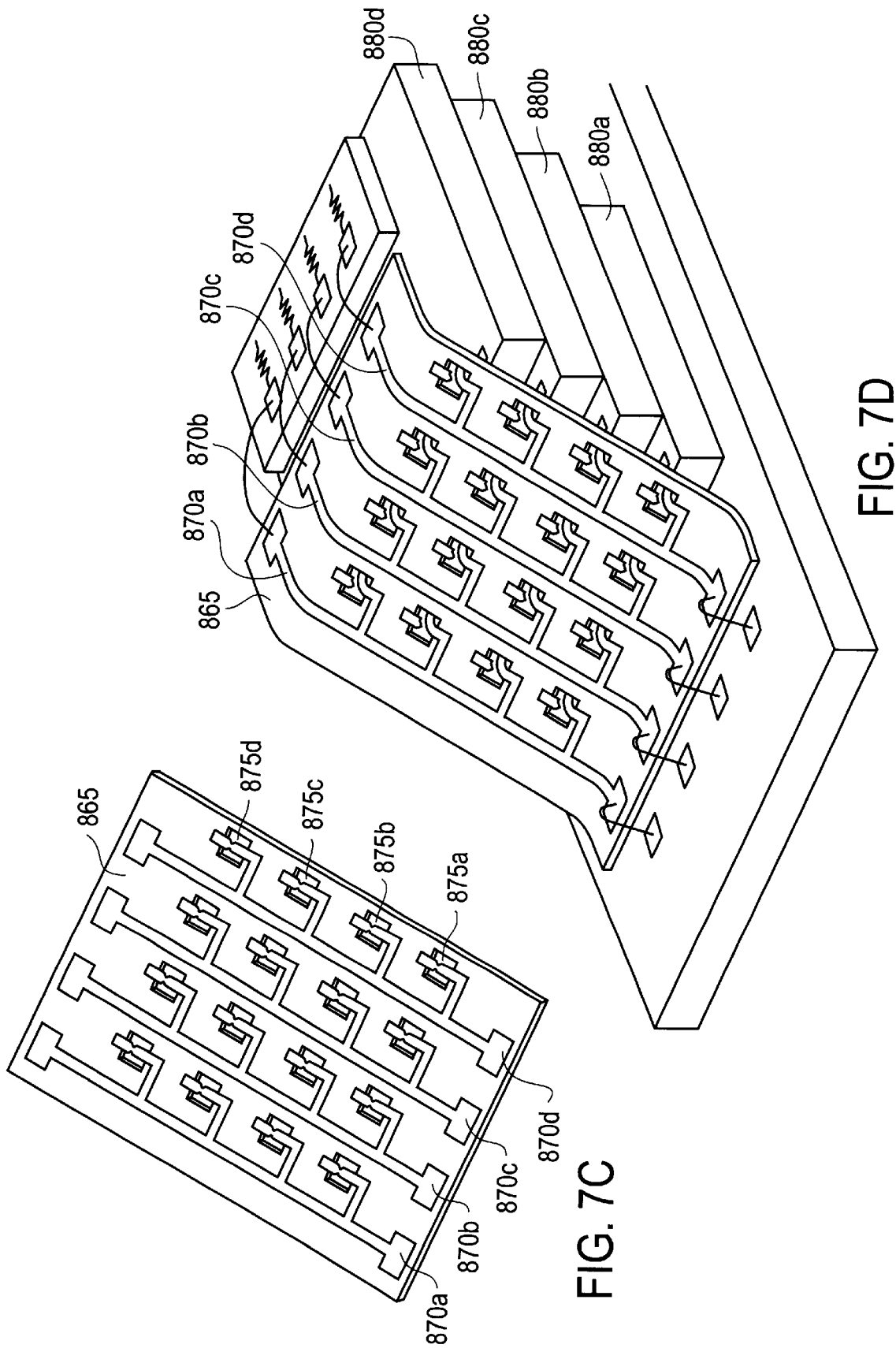

REDISTRIBUTED BOND PADS IN STACKED INTEGRATED CIRCUIT DIE PACKAGE

This application is a divisional of U.S. application Ser. No. 09/685,941 filed Oct. 10, 2000 now U.S. Pat. No. 6,376,904, which is a continuation-in-part of U.S. application Ser. No. 09/471,304 filed Dec. 23, 1999.

BACKGROUND OF THE INVENTION

This invention relates to a multi-chip or stacked integrated circuit (IC) die device. More specifically, this invention is directed toward a multi-chip device having a plurality of IC die, for example, a plurality of memory die, a controller die and memory die, or a processor, controller and plurality of memory die.

One conventional technique employed to provide greater IC densification includes incorporating several IC die into a single package. There is demand for larger IC densification to more fully utilize system layout space for applications such as portable computers and cell phones. An attractive solution is offered by vertical integration of IC die. That is, a three-dimensional approach where IC die are disposed one on top of another to more fully utilize a vertical dimension.

With reference to FIG. 1, a conventional multi-chip device 100 having a plurality of IC die 110 and 120 disposed one on top of another is illustrated. IC die 110 is stacked on top of IC die 120 which is disposed on base or substrate 130. A plurality of bond wires 140a–140d electrically couple pads disposed on IC die 110 to pads disposed on IC die 120. Similarly, a plurality of bond wires 150a–150m electrically couple pads disposed on IC die 120 to pads disposed on base 130.

The physical configuration of multi-chip device 100 tends to relax demands on system layout space. By disposing the IC die (e.g., memory die) vertically, only a single IC die footprint is required thereby resulting in a reduction in system layout space from a lateral or horizontal perspective. Signal lines 140a–140d for example, control lines and address/clock lines are routed vertically between the IC die 110 and 120.

Contemporary stacked die configurations tend to minimize the length of the signal line path. That is, the contemporary approach for stacked die configurations, is to minimize the electrical path length of the signal lines. A stacked die configuration which seeks to minimize the length of the signal lines is described and illustrated in U.S. Pat. Nos. 5,675,180 and 5,698,895.

Contemporary stacked die configurations, like those described and illustrated in U.S. Pat. Nos. 5,675,180 and 5,698,895, employ a minimum signal line path length in order to decrease propagation delay of the signals on those lines. Decreasing the propagation delay between the die tends to increase the speed of operation of the overall system.

In addition to presenting a minimum propagation delay of the signals applied to the signal lines, stacked die configurations employing a minimum signal line path length tend to minimize parasitic capacitance and inductance resulting from the interconnects. In general, this approach may promote faster operation because signal line lengths and corresponding propagation delays are reduced.

FIG. 2A is a schematic diagram of a plurality of conventional IC die in a stacked die configuration coupled to a signal line employing minimal conductor length between each IC die. Here the plurality of IC die 310a–310d are inter-coupled via conductors 320a–320d, respectively. Conductors 320a–320d represent a signal line. Load capacitances 330a–330d represent the load capacitance presented by IC die 310a–310d which are coupled to the signal line. In this regard, when electrically coupling IC die to signal bussing, the signal lines become loaded with the inherent load capacitance which is due to the various elements of the I/O structures disposed on the integrated circuit, for example, bond pads, electrostatic discharge protection devices, input buffer transistors, and output driver transistors.

Because the length of conductors 320a–320d are minimized, conductors 320a–320d exhibit, as a practical matter, negligible inductance. Thus, load capacitances 330a–330d are effectively lumped producing an overall equivalent or lumped capacitive characteristic. Here, the capacitive characteristic is present between a ground plane 340 which is common to IC die 310a–310d and conductors 320a–320d.

One method for providing an increase in bandwidth and overall performance of a memory system, is to increase the effective data rate at which data may be transferred to and from each memory device (i.e., the data rate). In memory systems, one conventional approach to achieve such an increase is to increase the clock rate of the system, which tends to increase the data rate of the system and, in turn, the bandwidth.

However, as the data rate increases in multi-chip devices, the lumped capacitive characteristic mentioned above requires increasingly more drive capability from output drivers of the IC die 310a–310d to drive data onto conductors 320a–320c. That is, as the data rate increases, an increasingly large amount of current is needed in the same given period of time to drive the lumped capacitive characteristic at a faster rate. Driver current for an output driver transmitting on an un-terminated lumped capacitive load is illustrated in FIG. 2B.

As data rates increase in systems employing minimal or short signal lines between IC die of a stacked die device, the number of IC die which may be coupled along the signal line decreases. As mentioned above, minimal or short signal lines between IC die of a stacked die device tend to result in negligible inductance separating each load capacitance along the signal line. Since each IC die increases the overall lumped load capacitance of the signal line in such a system, the maximum practical number of IC devices which may be coupled to the same signal line tends to become constrained or limited by the drive capability of the drivers on the IC die.

Stacked die configurations employing a minimal conductor length provide relatively fast access times. These configurations, however, suffer a number of shortcomings including a limitation on the maximum practical number of IC devices which may be coupled to the same signal line—i.e., a limit on the amount of vertical integration. Minimum interconnect stacked die configurations place high demands on the output drivers, which imposes an operation speed limitation on the system or a limitation on the number of devices or die coupled to the signal line. Thus, there is a need to provide an effective configuration which has fast access times, increases the operation speed of a multi-chip or stacked die device, and provides more flexibility in vertical integration.

SUMMARY OF THE INVENTION

A semiconductor module has a first integrated circuit die having a planar surface. The first integrated circuit die comprises a first conductive pad disposed substantially on the planar surface and a redistributed conductive pad electrically connected to the first conductive pad. The redistributed conductive pad is disposed near a periphery of the planar surface. The semiconductor module further has a second integrated circuit die stacked adjacent to the planar surface and offset from the periphery, such that a second conductive pad on the second integrated circuit die can be electrically connected to the redistributed conductive pad.

A semiconductor module is made from existing integrated circuit dice by redistributing a first conductive pad disposed substantially on a planar surface of a first integrated circuit die to a redistributed conductive pad disposed near a periphery of the planar surface. This may be undertaken by applying a conductive layer to the planar surface of the first integrated circuit die, and forming a redistributed conductive pad and a conductive trace from the conductive layer, where the conductive trace electrically connects the first conductive pad and the redistributed conductive pad. A second integrated circuit die is then stacked adjacent to the planar surface and offset from the periphery. Finally, a second conductive pad on the second integrated circuit die is electrically connected to the redistributed conductive pad.

BRIEF DESCRIPTION OF THE DRAWINGS

In the course of the detailed description to follow, reference will be made to the attached drawings, in which:

FIGS. 7A, 7B, and 8 and 9 illustrate a cross-section representation of a multi-chip device having a plurality of integrated circuit die formed according to other embodiments of the present invention;

FIGS. 7C and 7D illustrate a multi-chip device using flex tape according to an embodiment of the invention;

DETAILED DESCRIPTION

Figure 1:
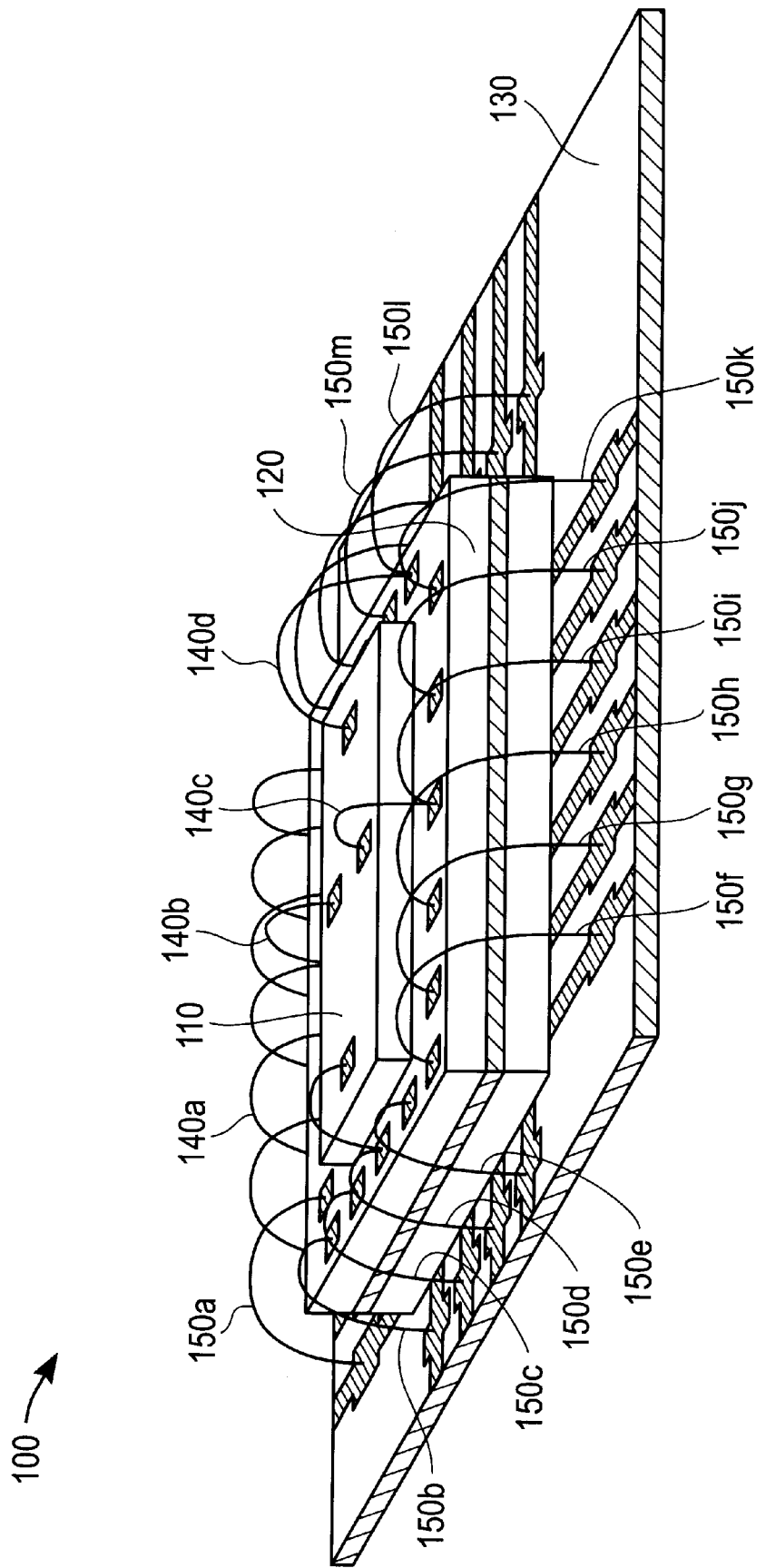
FIG. 1 illustrates a conventional multi-chip device having a plurality of integrated circuit die disposed one on top of another.

The present invention is directed towards a multi-chip device which includes a plurality of stacked integrated circuit (IC) die and a plurality of interconnect signal lines having predetermined line lengths. The plurality of IC die (for example, a dynamic random access memory (DRAM)) may be housed in a package using conventional IC packaging techniques, or disposed on a base having connectors such as ball bonds or leads for connecting to external signal lines or interfacing with external circuitry or devices. The plurality of interconnect signal lines electrically couple or interconnect the IC die and, under circumstances where the IC die are disposed on a base or substrate, interconnect the IC die to the base or substrate as well. The plurality of signal lines may integrate a high speed bus or a "flow-through" portion of a high speed bus with the plurality of integrated circuit die in or on the multi-chip device. The predetermined line lengths may be selected to match the characteristic impedance of the interconnect signal lines to external signal lines (or transmission lines).

The present invention employs circuitry and techniques to increase IC densification, optimize space utilization, increase speed, and relax output driver current in a multi-chip device. According to the present invention, a plurality of IC die occupy the horizontal or lateral area equivalent to one IC die footprint. Utilization of the vertical dimension more fully optimizes space usage in, for example, a memory system implemented on a circuit board.

The present invention may be employed to increase computer or memory system operation speed relative to contemporary systems and/or ease demands on internal device output drivers. For example, using the techniques of the present invention, a plurality of high speed memory devices (e.g., eight die or devices) may be optimized in a multi-chip device to operate at a substantially increased data rate (e.g., greater than 400 MBits/sec) as compared to data rates of conventional memory systems (e.g., 100–400 MBits/sec). The present invention employs transmission line techniques to provide high frequency range operation and increased bandwidth.

In one embodiment, the multi-chip device includes a plurality of IC devices coupled to at least one multi-drop transmission line. The end of the multi-drop transmission line may be connected to a termination voltage using a termination element (e.g., a resistor or resistive element). Conductors or interconnect segments comprising the multi-drop transmission line are coupled between each IC device. In one embodiment, the multi-drop transmission line has a controlled impedance that is produced by a selected, calculated and/or predetermined length of conductors coupled between each drop point. In one example, the internal transmission line impedance is predetermined or selected to match the impedance of an external signal line to prevent or minimize signal reflections.

In another embodiment, the multi-chip device includes a plurality of IC devices coupled in a flow-through bus configuration. Here, the plurality of IC devices are coupled to at least one multi-drop transmission line. Both ends of the multi-drop transmission line couple to circuitry which is external to the multi-chip device via, for example, ball bonds or pins. In this embodiment, a portion of a transmission line bus may be realized directly within the multi-chip device itself using a flow-through approach. A plurality of multi-chip devices may be coupled in a serial configuration permitting the signals to propagate past each multi-chip device in serial fashion. By bringing the bus closer to the integrated circuit die, the lengths of stubs (i.e., conductors which electrically connect the signal lines of the bus to the circuitry on the IC die) are reduced and operation speeds may be increased significantly compared to conventional systems which feature conventional IC devices having leads coupled to a transmission line bus on an external printed circuit board.

With reference to FIGS. 3A, 3B, 3D and 3F, representational cross-section views of a multi-chip device formed in accordance with embodiments of the present are illustrated. Multi-chip device 400 includes IC die 410a–410h, base 420, spacer 430, conductors 440a–440i, and termination element 450. IC die 410a–410h are disposed on base 420. IC die 410a–410h are disposed one on top of another in a "stacked" configuration. Alternatively, IC die 410a–410h may be disposed side by side, or edge to edge on a two dimensional plane while incorporating the techniques of the present invention.

Conductors 440a–440i interconnect IC die 410a–410h and termination element 450. The termination element 450 may be a resistor. Conductors 440a–440h are coupled between bond pads (not shown) on adjacent die of IC die 410a–410h. That is, conductor 440a is connected between substrate 420 and bond pad(s) on IC die 410a, conductors 440b–440h are connected between bond pads on IC die 410a–410h, conductor 440i is connected between bond pad(s) on IC die 410h and termination element 450, and conductor 440j is connected between termination element 450 and a termination voltage source (not shown), for example, a Vcc bus. Conductors 440a–440j may be formed using various technologies such as wire bonding, or flexible circuit tape. In accordance with this specific embodiment of the present invention, conductors 440a–440j or conductors 440b–440j form a transmission line.

Figure 3A:
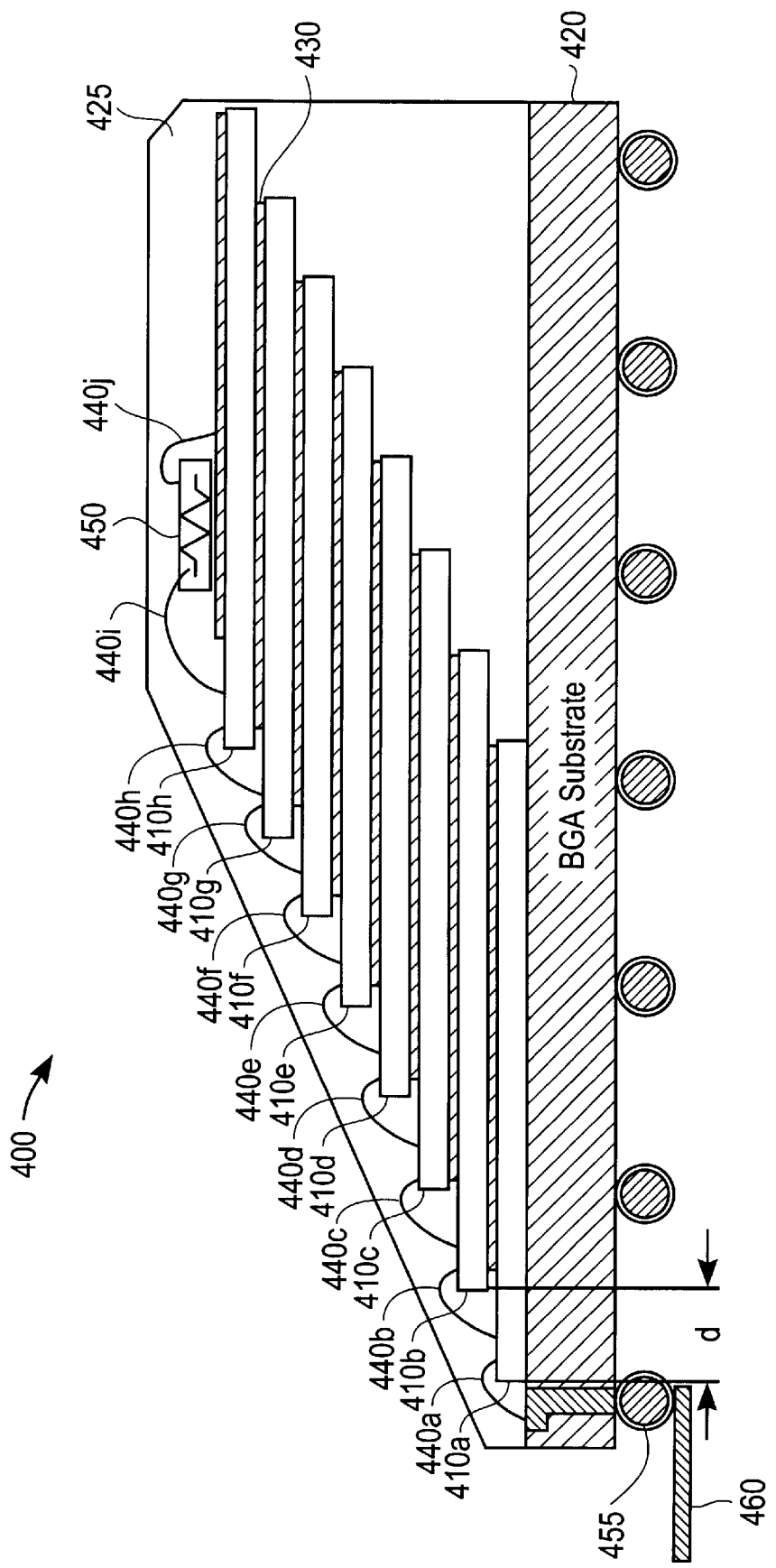
FIGS. 3A, 3B, 3C and 3D illustrate representational cross-section views of a multi-chip device formed in accordance to embodiments of the present invention.
Figure 3B:
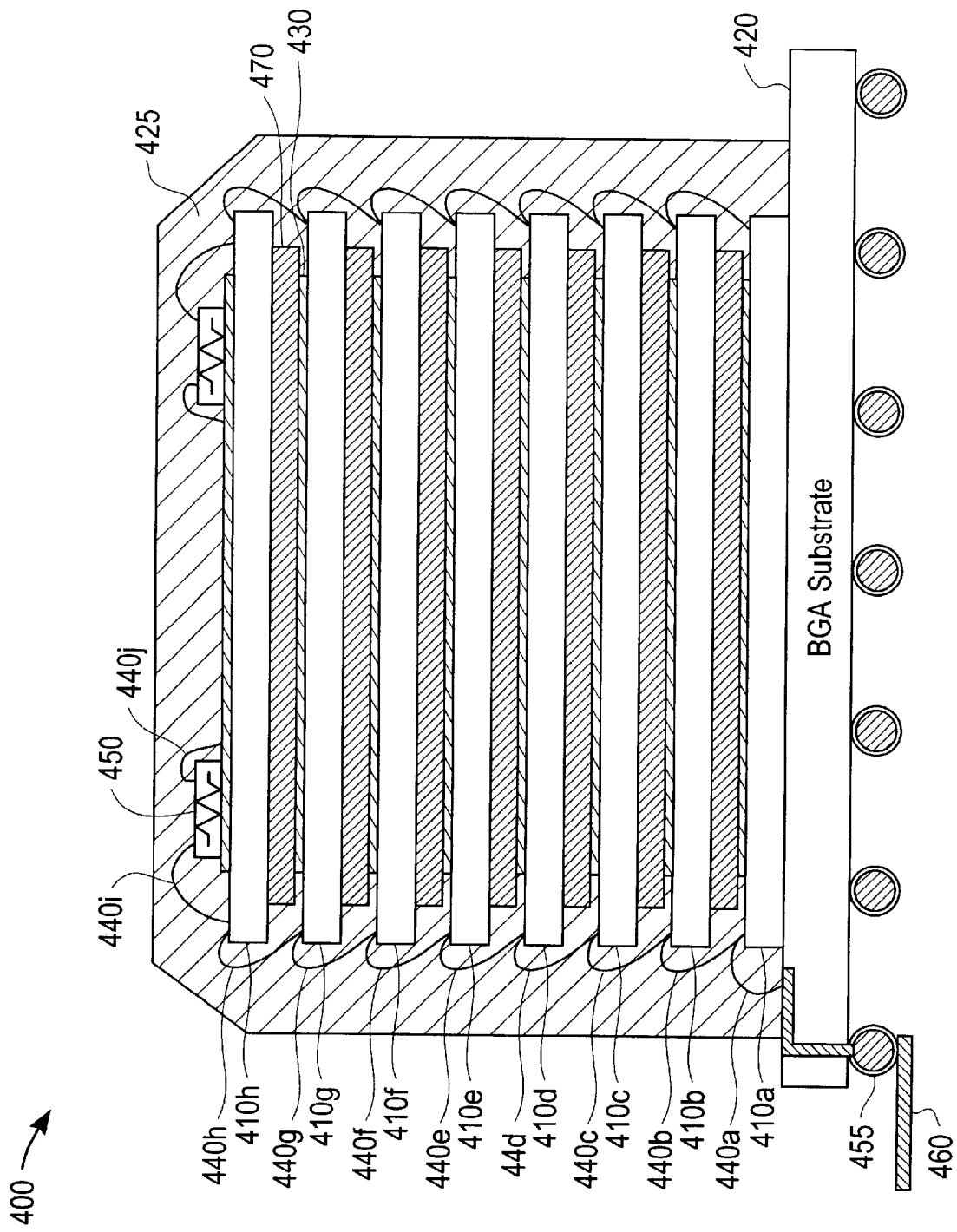
Figure 3C:
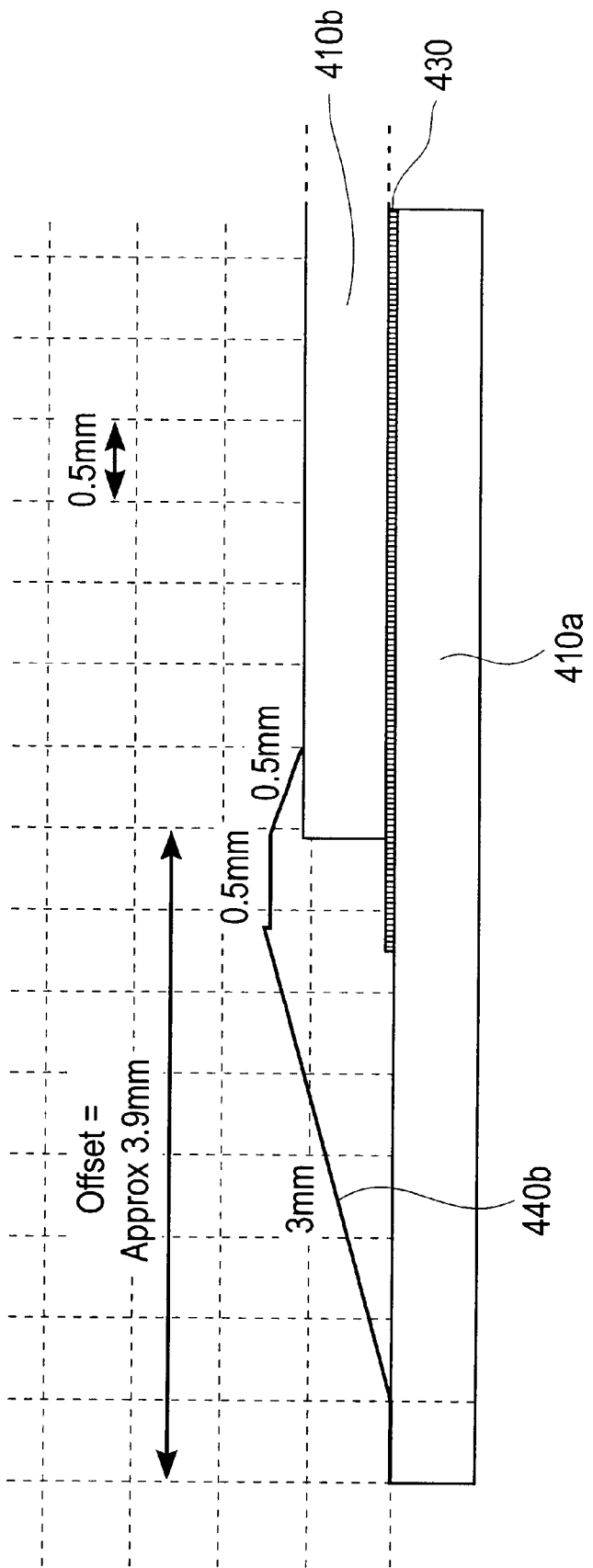
Figure 3D:
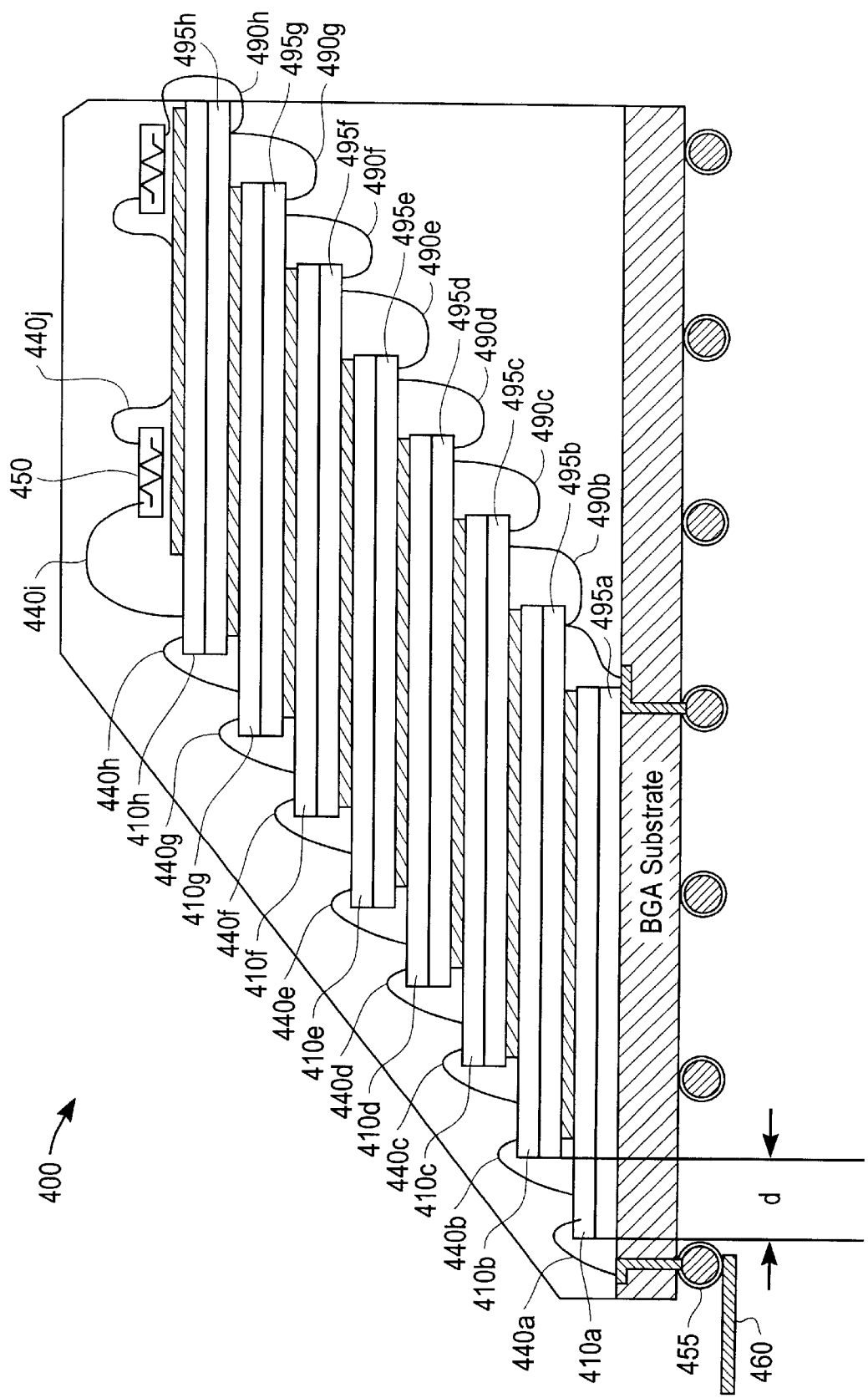

With continued reference to FIGS. 3A, 3B, and 3D, base 420 may be a common IC substrate such as a ball grid array (BGA) substrate or pin grid array (PGA). IC die 410a–410h may be mounted on base 420 and encapsulated, for example, in epoxy over-mold 425. Connectors such as leads or ball bonds couple the transmission line to external devices, for example, a memory controller, other multi-chip devices, or bus transceivers via external signal lines or external transmission lines. For simplicity, only one connector 455 electrically connected to external transmission line 460 is shown. Similarly, only one transmission line comprising conductors 440a–440h coupled to external transmission line 460 via connector 455 is shown. A plurality of connectors, such as ball bonds or leads may couple respective transmission lines to a corresponding plurality of external signal lines.

Impedance ratios are often employed in determining how well signal energy is transported between the external signal line and the transmission line (i.e., conductors 440a–440j and associated load capacitances). The characteristic impedance value of the external transmission line 460 may be matched to the characteristic impedance of the internal transmission line using various techniques described below. These characteristic impedance values may be suitably matched to optimize the signal energy transport or to substantially eliminate signal reflection.

With further reference to FIGS. 3A, 3B, and 3D, termination element 450 terminates an end of the transmission line to a termination voltage (not shown), e.g., Vdd or GND. Termination element 450, in a preferred embodiment, is a resistor or resistive element which is matched to the characteristic impedance of the internal transmission line. For example, each of conductors 440a–440j may be selected as 4 mm length bond wires in forming a transmission line with characteristic impedance of 28 ohms. The length, diameter, and inductance of these bond wires are ready examples of parameters which significantly impact the characteristic impedance of the internal transmission line. Termination element 450 may be selected as a 28 ohm resistor to match the transmission line impedance of 28 ohms. It should be noted that termination element 450 may be appropriately selected to avoid or minimize signal reflections when multi-chip device 400 is in operation.

It should be noted that termination element 450, although illustrated as external to the IC die 410, may be implemented on one or more of the IC die 410. Application Ser. No. 09/387,842 describes and illustrates implementing a termination element on at least one IC die in a memory system/sub-system environment. Application Ser. No. 09/387,842 is hereby incorporated by reference.

In the embodiment illustrated in FIG. 3A and 3D, an edge of each IC die may be horizontally offset, positioned or skewed by a distance "d" (for example, d is approximately 3.9 mm) with respect to an edge of a vertically adjacent IC die. The offset feature, in conjunction with the conductor layout, is illustrated in more detail in FIG. 3C. The offset feature may be employed to allow a predetermined spacing between pads on adjacent IC die. The lengths of each conductor electrically connected between the pads may be selected in accordance with the predetermined spacing in an embodiment of the present invention.

Spacer 430, (e.g., polyimide) is disposed between vertically adjacent IC die. Spacer 430 may be disposed to adjust or allow clearance for coupling conductors between two adjacent IC die and/or for thermal considerations. In one embodiment, the spacer material has a thickness of 0.06 mm and each die has a thickness of 0.5 mm.

With reference to FIG. 3B, a plurality of IC dice 410a–410h are disposed and aligned as a single column instead of being horizontally offset with respect to one another as is shown in FIG. 3A. Here, the back of each IC die is disposed over the face of each IC die positioned immediately underneath in a stack configuration. Alternatively, IC die 410a–410h may be disposed back to back, face to face or in a combination thereof. In addition, the plurality of IC die may be disposed horizontally with an edge of each IC die disposed on a common horizontal plane. This is equivalent to rotating the multi-chip device stack configuration illustrated in FIG. 3B by ninety degrees.

By disposing each pair of IC die back to back, pads disposed at a periphery region of an adjacent or opposite edge of each die may be coupled to conductors as shown in FIG. 3D. Here, conductors 490b–490h are coupled between bond pads (not shown) on adjacent die of IC die 495a–495h. Back sides of each of IC die 495a–495h are attached to back sides of IC die 410a–410h.

With continued reference to FIG. 3B, a thermally conductive spacer 470 is disposed between adjacent IC die. Here, thermally conductive spacer 470 aids in dissipating heat generated when in operation. It should be noted that thermally conductive spacer 470 may also be implemented in the embodiments of FIGS. 3A and 3D.

FIGS. 3A and 3D illustrate one conductor coupled between pairs of adjacent IC die. It should be noted that IC die 410a–410h each may include a respective plurality of bond pads for coupling a plurality of conductors between two adjacent IC die. This is illustrated in FIG. 4B. Here, a plurality of pads 550a–550d are disposed on a periphery region of IC die 410a–410h. Conductors, for example, bond wires, may couple pads aligned proximally on vertically adjacent IC die.

With continued reference to FIG. 4B, each conductor may be considered as an impedance in a multi-drop transmission line. Each of pads 550a–550d may be considered as a drop point at which each load of the multi-drop transmission line is coupled thereto. Each of pads 550a–550d may be spaced equidistant from one another and/or have identical structures to match electrical characteristics which may be effectuated by the IC substrate, electrostatic discharge protection devices, input transistors, output drivers, and input/output (I/O) interconnect lines. Each of pads 550a–550d and associated circuit features contribute a capacitive load to the multi-drop transmission line. By connecting the transmission line directly to the bond pads of the IC die (see FIGS. 3A, 3B, 3D, 7A and 7B), conventional I/O structures such as package leads that contribute to longer stub lengths are eliminated. Decreasing stub lengths minimizes discontinuities along the transmission line and permits the impedance of the transmission line to be more readily controlled.

According to one aspect of the present invention, one important electrical characteristic stems from the inductance to capacitance ratio associated with each conductor coupling vertically adjacent pads. The inductance to capacitance ratio is often described in terms of characteristic impedance by taking the square root thereof. By substantially matching the characteristic impedance of a transmission line formed by conductor 440b–440h (FIGS. 3A and 3B) and the associated I/O load capacitances, optimum energy transfer occurs.

A reflection coefficient is indicative of the relative amount of signal reflection (e.g., voltage reflection) that may occur at a junction between two impedances, e.g., the point where conductors 440a–440j meet external transmission line 460. Characterizing conductors 440a–440j by an impedance Zo", and external transmission line 460 by an impedance Zo', reflection percentages and reflection coefficients for an exemplary Zo' value of 50 ohms and corresponding range of Zo" values is shown in table 1. If Zo', Zo" and termination element 450 (FIGS. 3A, 3B, and 3D) are perfectly matched, then the reflection coefficient is zero and perfect matching of impedances occurs. Instead of being perfectly matched, impedances Zo' and Zo" may be matched to be within a predetermined range of each other, which may result in small reflections. It should be noted that termination element 450 is assumed to be perfectly matched to Zo" in the example above.

For example, in an embodiment according to the present invention, impedances Zo' and Zo" may matched in the range of between approximately 70 and 130 percent. In table 1, this range corresponds to a range of reflection coefficients of between approximately minus eighteen and twelve. Relative reflections outside of this range may be detrimental to operation, depending on the margins employed in the signaling scheme. Margins are determined by the threshold points which distinguish between voltage or current amplitudes and corresponding symbol representations or definitions.

TABLE 1

| Zo' (ohms) | Zo" (ohms) | coefficient of reflection | % match |
|---|---|---|---|
| 50 | 27 | −30 | 54 |
| 50 | 29 | −27 | 58 |
| 50 | 32 | −22 | 64 |
| 50 | 35 | −18 | 70 |
| 50 | 39 | −12 | 78 |
| 50 | 42 | −9 | 84 |
| 50 | 47 | −3 | 94 |
| 50 | 50 | 0 | 100 |
| 50 | 52 | 2 | 104 |
| 50 | 57 | 7 | 114 |
| 50 | 63 | 12 | 128 |
| 50 | 69 | 16 | 138 |
| 50 | 76 | 21 | 152 |
| 50 | 83 | 25 | 166 |
| 50 | 92 | 30 | 184 |

Figure 5A:
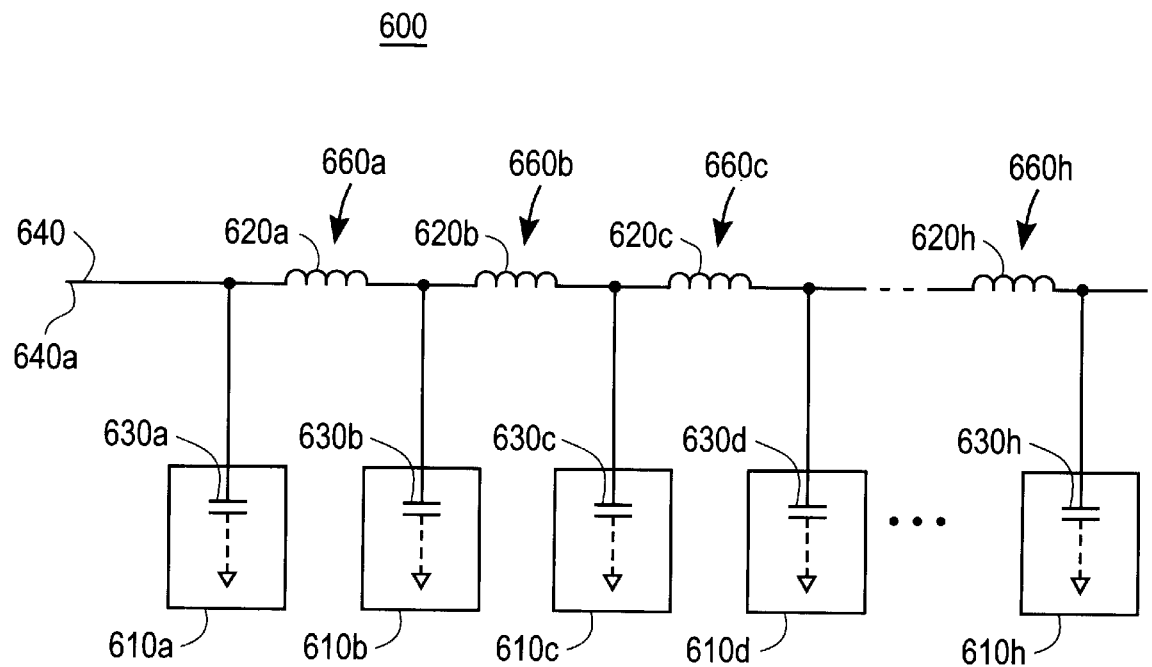
FIG. 5A illustrates a schematic of a multi-drop transmission line according to an embodiment of the present invention.

FIG. 5A illustrates an electrical representation of a multi-drop transmission line in accordance with an embodiment of the present invention as illustrated in FIGS. 3A and 3B. Multi-drop transmission line 600 is employed in multi-chip device 400 to couple pads on IC die 410a–410h and termination element 450 (FIGS. 3A, 3B, and 3D). In FIGURE 5A, IC die model 610a–610h include equivalent load capacitances 630a–630h to a common or ground potential. In this embodiment, a plurality of equivalent inductance elements 620a–620h are coupled between each equivalent load capacitance 630a–630h of the respective IC die model 610a–610h. Each equivalent inductance element 620a–620h models a conductor having a calculated, derived, predetermined, substantially equal, uniform or non-minimum length.

End 640 may be coupled to an external signal line having a calculated, predetermined, simulated or approximated "external" characteristic impedance value. This "external" characteristic impedance value may be utilized in forming the multi-chip device in accordance with another embodiment illustrated below.

Figure 2A:
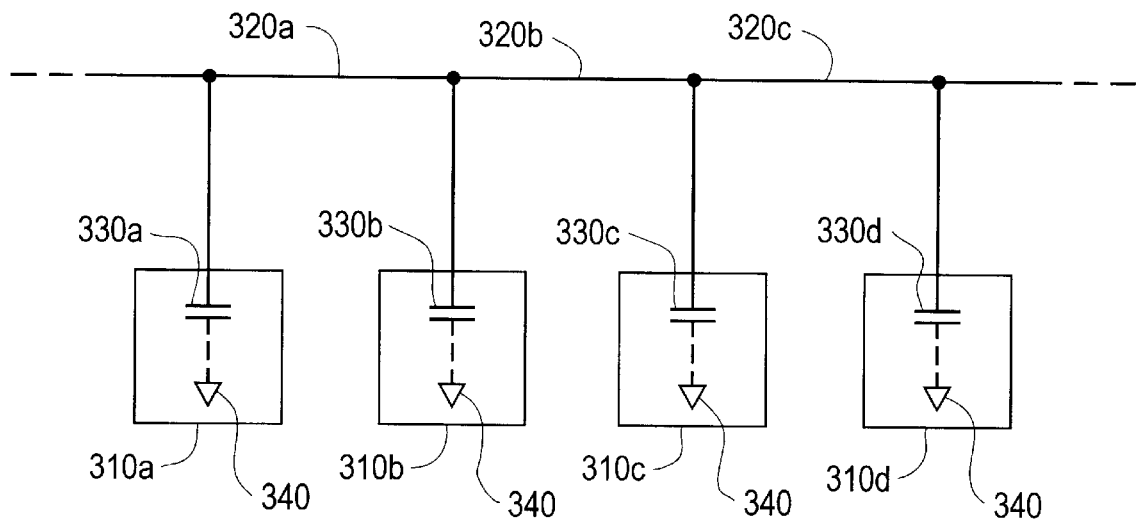
FIG. 2A illustrates a schematic representation of a plurality of integrated circuit die coupled to a signal line according to conventional configurations employing minimal conductor length between devices.
Figure 2B:
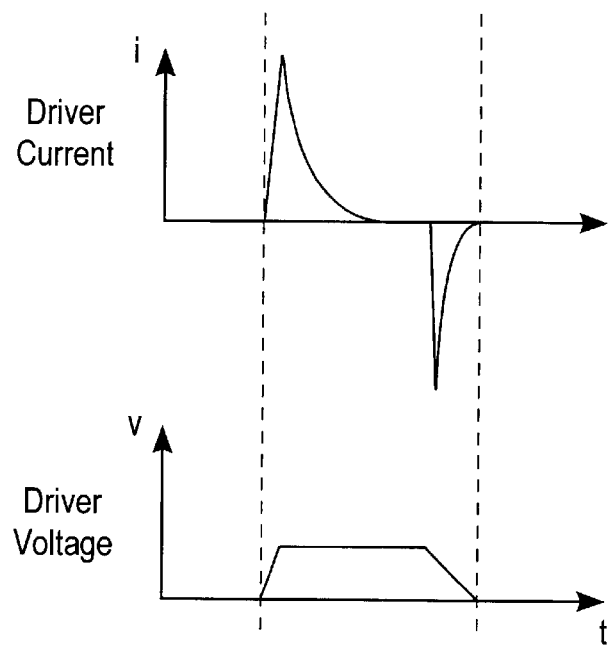
FIG. 2B illustrates driver current in an output driver driving a lumped capacitive load.
Figure 5B:
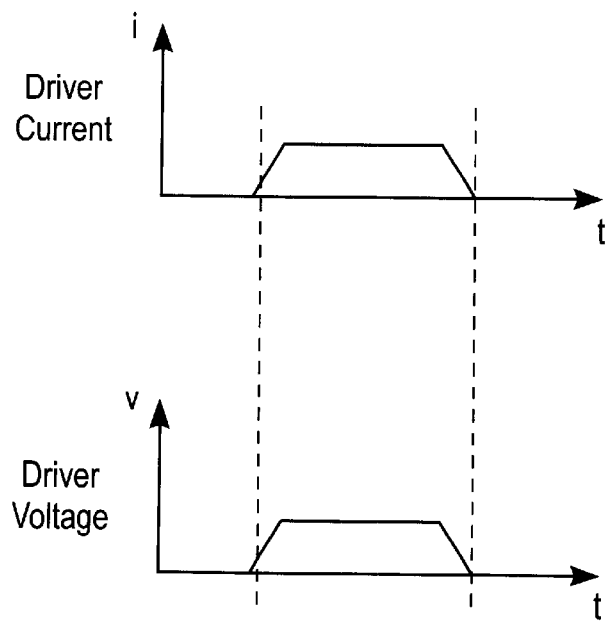
FIG. 5B illustrates driver current for an output driver driving a terminated transmission line in accordance with an embodiment of the present invention.

In operation, equivalent inductance elements 620a–620h and equivalent load capacitances 630a–630h may determine a propagation delay time between adjacent load capacitances. By introducing the delay time, each of load capacitances 630a–630h is charged in serial fashion by a signal being driven from one signal line end 640. This results in a relatively smaller amount of current required to drive the signal line than the multi-chip device employing the minimum interconnect approach. This is illustrated in FIG. 5B when compared to the driver current characteristic in the un-terminated lumped capacitive example illustrated in FIG. 2B.

The minimum interconnect approach employed in the conventional multi-chip device described above produced a larger lumped capacitive characteristic, thus requiring a relatively larger amount of current drive by the drivers. By way of comparison, the lumped capacitance effect is avoided in the present invention and smaller sized driver circuits may be used due to the smaller current drive requirements. Smaller sized driver circuits occupy less area on an IC die and tend to be easier to realize. In addition, since the demands on the output drivers of each IC die are reduced, an increased number of IC's may be coupled along a transmission line in the multi-chip device.

Based on a minimum impedance ($Z_{min}$) and load capacitance ($C_{load}$), one method for determining an optimized minimum inductance value for the inductance elements 620a–620d illustrates an aspect of the present invention. The minimum impedance $Z_{min}$ of the bond wire may be calculated by dividing the desired voltage swing (dv) on the signal line by the amount of current (i) to be driven on the signal line (i.e., $Z_{mi}$=dv/i) by an IC die (i.e., by an output driver). The minimum inductance $L_{min}$ may be then calculated using the relationship:

$$L_{min} = (Z_{min} \times \sqrt{C_{load}})^2$$

where, $C_{load}$ is the load capacitance exhibited by the IC die.

For example, in a specific embodiment, the IC die presents a load capacitance of 2.2 pF and utilizes a voltage swing of 800 mV along with a driver current (i) of 26.7 mA. Substituting in the equation above yields an $L_{min}$ of 1.57 nH.

Based on the resonant frequency ($\omega_o$), an example method for determining an optimized maximum inductance value for the conductors may be illustrated. For example, the maximum inductance $L_{max}$ may be calculated using the relationship:

$$L_{max} = \left( \frac{1}{2\pi \times \omega_o \times \sqrt{C_{load}}} \right)^2$$

For example, where the operation frequency is 500 MHz, as a rule of thumb, the resonant frequency $\omega_o$ of, for example, a bond wire implemented in one of the conductors 440a–440i in FIG. 3A, should be higher than the third harmonic (i.e., greater than 1.5 GHz) of the operating frequency. Substituting 1.5 GHz as the resonant frequency $\omega_o$, and a load capacitance of 2.2 pF into the equation above yields a maximum inductance ($L_{max}$) of 5.12 nH.

Thus, in the foregoing example, the target inductance range for each of inductance elements 520a–520d is between 1.57 nH and 5.12 nH. In calculating the target inductance range, a conductor having a predetermined length may then be formed to suit the physical constraints of the multi-chip device. For example, by applying the above range to a bond wire having an inductance of 1 nH per 2.5 mm yields a conductor having a length in the range of between 4 mm and 12.8 mm.

The specific impedance values, frequencies, dimensions, and relationships between the same are provided as examples only. Other methods may be employed to select, determine, calculate, define or control the inductance of conductors 660a–660h to create the multi-drop transmission line 600. For example, a field solver (a software tool which calculates the spatial and temporal distributions of electric and magnetic fields in the system) or a computer program performing simulations which include factors based on parasitics and/or electromagnetic phenomena may be employed. Moreover, other types of calculations and/or factors may be deemed more appropriate based on the specific multi-chip device application or operation frequency.

Figure 6A:
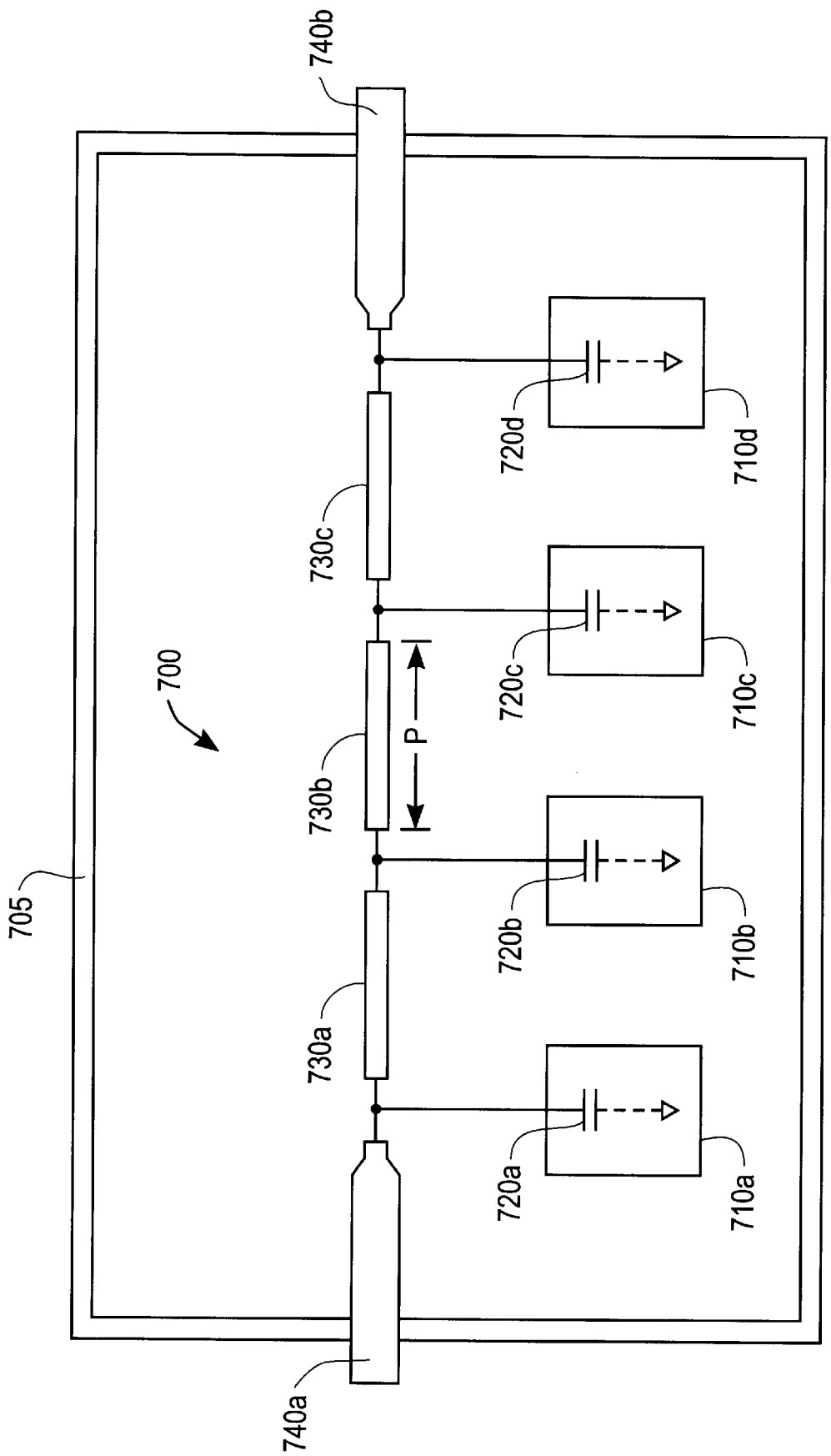
FIGS. 6A, 6B, 6C, and 6D illustrate schematics of a multi-drop transmission line and multi-chip devices formed in accordance with embodiments of the present invention.

With reference to FIG. 6A, a schematic diagram of a multi-drop transmission line formed in accordance to an embodiment of the present invention is illustrated. Here, multi-drop transmission line 700 may be employed to calculate the unit length of conductors 730a–730c to match impedance between multi-drop transmission line 700 and the characteristic impedance of one or more external signal lines connected thereto. Multi-drop transmission line 700 is housed inside IC package 705 of a multi-chip device. This example is equally applicable in disposing conductors in, for example, multi-chip device 400 of FIGS. 3A and 3B.

A plurality of IC device models 710a–710d include representative load capacitances 720a–720d each coupled to a transmission line comprising conductors 730a–730c. Signal lines 740a and 740b represent external signal lines, for example, external signal lines of a bus. In this configuration, the transmission line may model a portion of a bus which may be impedance matched to adjacent external portions thereof for optimal, high speed operation.

According to an embodiment of the present invention, the characteristic impedance of signal lines 740a and 740b along with the unloaded impedance of conductors 730a–730c may be employed to determine the pitch "P" of each conductor 730a–730c. In this specific embodiment, external signal lines 740a and 740b have a wider cross-section than conductors 730a–730c. Since the impedance of a conductor decreases as the width of the conductor is increased, the impedance observed at signal lines 740a and 740b is less than the impedance of conductors (i.e., 730a–730c). This is assuming a constant dielectric characteristic and an unloaded state (i.e. with no load capacitances 720a–720d attached to the transmission line). Although different widths are shown, other physical characteristics may cause the impedances of transmission line 700 and signal lines 740a and 740b to be mismatched. The impedance of conductors 730a–730c will decrease when load capacitances 720a–720d are connected to conductors 730a–730c as shown in FIG. 6A. In this specific embodiment, pitch "P" is calculated to yield a specific "loaded" impedance ($Z_L$) to match the characteristic impedance of signal lines 740a and 740b to the characteristic impedance of a transmission line formed by conductors 730a–730c along with load capacitors 720a–720d. As such, spacing "P" may be calculated using the relationship:

$$P = \frac{C_{Load}}{\frac{L}{Z_o^2} - C}$$

where: $C_{Load}$ represents common load capacitances 720a–720d;

$Z_o$ is the characteristic impedance of conductors 730a–730c (matched to the signal lines 740a and 740b); and L and C are distributed inductance and capacitance values respectively.

It should be noted that other methods may be employed to determine, calculate, define or control the length of conductors 730a–730c to create the multi-drop transmission line model 700, for example, computer assisted layout and modeling. In addition, other methods may be employed to match the multi-drop transmission line impedance to external signal lines, for example, field solvers may be employed to calculate the capacitances and inductances in a memory system.

Figure 6B:
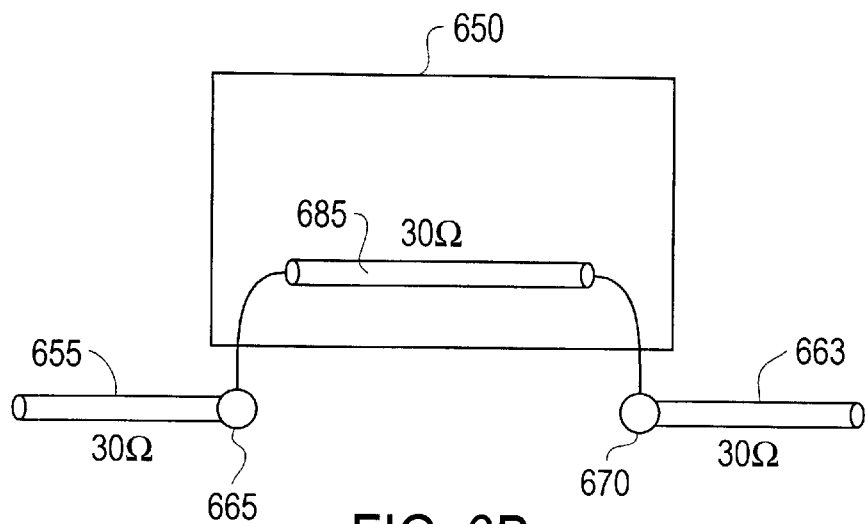
Figure 6C:
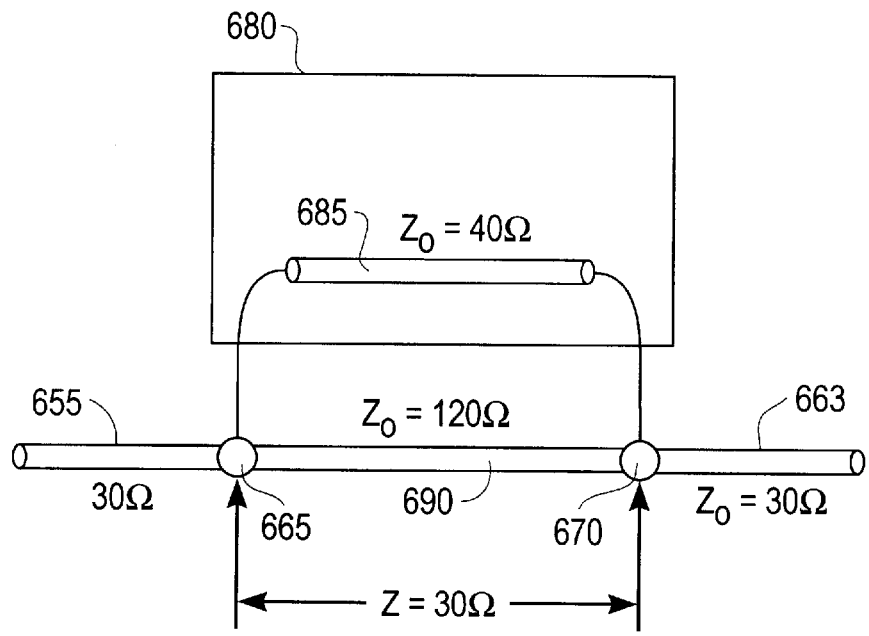

Another approach employed to match the impedance of the multi-drop transmission line to the impedances of external transmission lines (i.e., signal lines) may utilize an additional internal/external transmission line, stub, or means to alter the impedance between a pair of terminals defining the impedance to be matched. To exemplify this approach, FIGS. 6B and 6C illustrate embodiments of a multi-chip device coupled to external transmission lines in a "flow-through" approach. FIG. 6C illustrates the employment of an additional transmission line to match the impedance viewed between two terminals. The "flow-through" approach is described in more detail below with reference to FIGS. 7A and 7B and is shown here by way of example. The techniques employed to match impedances using one or more additional transmission lines may apply to the terminated approach described above and is shown in FIG. 6D.

In the embodiment of FIG. 6B, impedances of transmission lines 655 and 663 are substantially matched to the impedance of multi-drop transmission line 685. Multi-drop transmission line 655 includes an impedance of 30 ohms and is electrically connected to transmission lines 655 and 663 at terminals 665 and 670 respectively. The multi-drop transmission line impedance viewed between terminals 665 and 670 and transmission lines 655 and 663 are each 30 ohms, respectively. Thus, the impedances of transmission lines 655, 663 and multi-drop transmission line 655 are substantially matched (e.g., within 70–130 percent). These impedances may also be matched to within a range of each other as described above. Moreover, a plurality of transmission lines may be employed in like fashion with the techniques described herein.

In FIG. 6C, the same reference numbers are utilized to connote like elements in multi-chip device 680. Multi-drop transmission line 685 includes an impedance of 40 ohms and is electrically connected in parallel with external transmission line 690 disposed between terminals 665 and 670. An impedance (Z) of 30 ohms results between terminals 665 and 670 from the parallel combination of the 40 ohm impedance of multi-drop transmission line 685 and the 120 ohm impedance of external transmission line 690. The impedance of external transmission line is 690 selected to substantially match impedances in the system. By matching impedances, similar delays result between terminals 665 and 670 when multi-chip devices 650 and 680 are in operation.

Figure 6D:
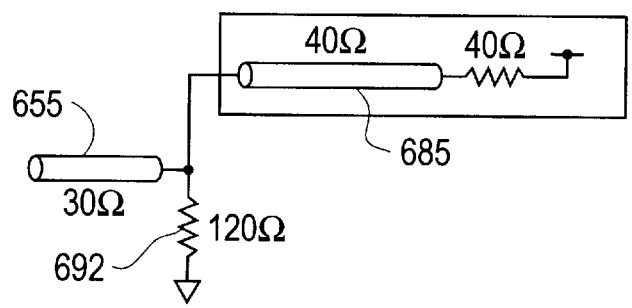

Other techniques may be employed to match impedances in the system, for example, in FIG. 6D, a stub line 692 is employed to match impedances. In this embodiment, transmission line 685 is terminated using a 40 ohm resistor. In yet other alternate embodiments, instead of being perfectly matched, impedances may be matched to be in the range of between 70 and 130 percent as described above in reference to Table 1.

In an embodiment of the present invention, the internal multi-drop transmission line may include an impedance in the range of between 10 to 75 ohms. Although shown as being disposed external to multi-chip device 680, external transmission line 690 may be also be disposed internally and, for example, be adjusted using fusible links.

With reference to FIGS. 7A and 7B, a cross-section representation of a multi-chip device having a plurality of IC die according to another embodiment of the present invention is illustrated. In these embodiments, two IC die "stacks" 810 and 820 are disposed on base 830. Here each of IC die stacks 810 and 820 are disposed in a similar configuration as the plurality of IC die shown in FIG. 3A. The IC die stacks 810 and 820 may also be disposed in a manner which is similar to the configuration of FIG. 3B.

In these specific embodiments, conductor 850 is employed to couple conductors between IC stack 810 and IC stack 820. In the embodiment shown in FIG. 7A, conductor 850 is disposed on a printed circuit board (PCB). In the embodiment of FIG. 7B, conductor 850 is disposed on a flexible polyimide substrate. Conductors disposed on a flexible substrate will hereinafter be referenced to as flex tape to denote any one of a number of flexible substrate materials supporting conductors or conductive traces. One embodiment of flex tape is illustrated in FIG. 7C. For simplicity, four conductive traces 870a–870d (i.e., copper interconnect) are shown residing on flex tape 865. By way of note, portions of conductive trace 870d are indicated as extending over corresponding formed apertures 875a–875d. Each of these portions is notched so as to form a break in a predetermined location over each of apertures 875a–875d as will be described below.

With reference to FIG. 7C and 7D, a method of forming a multi-chip device using flex tape according to an embodiment of the present invention will now be described. A plurality of IC die 880a–880d are formed and positioned as described above with reference to multi-chip device 400. Flex tape 865 is disposed such that each aperture is aligned over and proximal to pads exposed at a periphery region of IC die 880a–880d. Each portion of corresponding conductive traces 870a–870d that extend across each aperture (hereinafter referred to as "each portion") is broken at each notch location and bent to contact each pad situated beneath. In this embodiment a thermo-compression bonder applies mechanical force and heat to each portion to form the bond. The mechanical force causes a break to occur at the notched location. The mechanical force also causes each "broken" portion to extrude through its aperture to contact the respective underneath pad. The heat and mechanical energy causes each portion to bond to the respective pad. The thermo-compression bonder includes a plurality of beams that provide the heat and linear motion perpendicular to the plane of flex tape 865. During the bond process, each small beam travels in a linear path perpendicular to the plane of the aperture toward the pad and applies heat when the contact is made between each portion and the pad.

With further reference to FIGS. 7A and 7B, multi-chip device 800 may be incorporated in a "flow-through" bus approach. More specifically, a portion of a system bus may be realized directly in multi-chip device 800. For simplicity, only one multi-drop transmission line is shown and it is understood that the bus includes a plurality of multi-drop transmission lines. A plurality of multi-chip devices 800 may be coupled in a serial configuration permitting the signals to propagate through each multi-chip device in serial fashion. Multi-chip device 800 may be incorporated into a memory system with external termination elements (e.g., resistor elements) terminating each multi-drop transmission line at one end to avoid signal reflections. The termination element may also be implemented within one or more of the IC die of IC stack 810 and/or IC stack 820.

Opposite ends of the multi-drop transmission line may be coupled via leads or ball bonds situated proximal to or at corresponding ends of base 830. In operation, signals in a memory system (not shown) incorporating multi-chip device 800 may transport information such as clock, data, address information or control information via one end of the multi-drop transmission line, for example 860a. The signals propagate along conductors disposed between the IC die and exit at an opposite end of the multi-drop transmission line, for example 860b. The opposite end of the multi-drop transmission line may be terminated to a termination voltage using a termination element (e.g., an external resistor) or may couple to another multi-drop transmission line in another multi-chip device 800. The direction of transport may also be bi-directional, i.e., signals may propagate from 860b to 860a and vice versa.

Figure 4A:
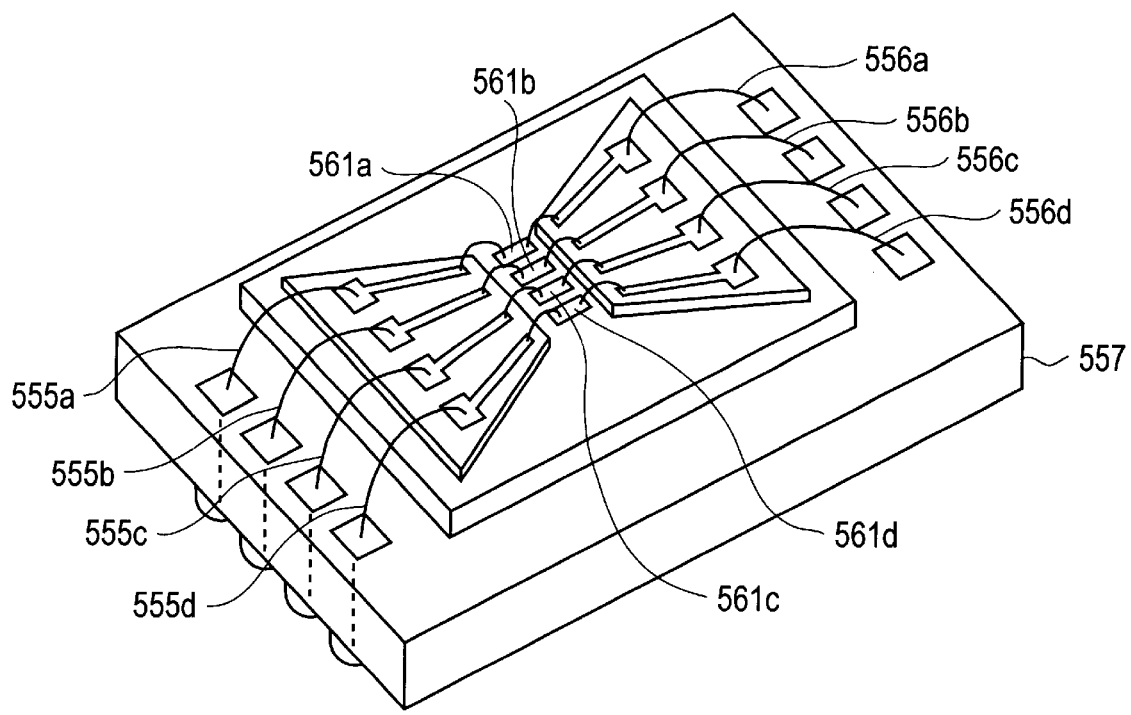
FIG. 4A illustrates a bond pad employed in a flow-through bus in accordance to an embodiment of the present invention.
Figure 4B:
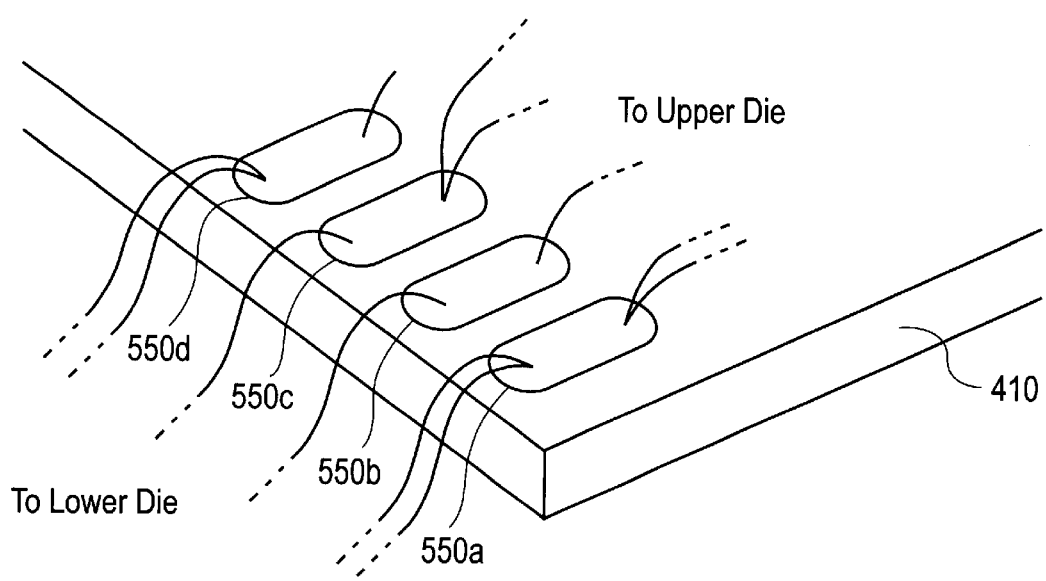
FIG. 4B illustrates a plurality of pads for coupling a plurality of conductors between two adjacent integrated circuit die in accordance with embodiments of the present invention.

FIG. 4A illustrates the broader concept of the flow-through approach according to an embodiment of the present invention. In the broadest concept, signal lines of a bus enter at one portion of IC package 557 and exit through another portion of IC package 557. A plurality of leads 555a–555d and 556a–556d are each connected to a corresponding bond pad 561a–561d. This approach may be well suited for tape automated bonding (TAB) type packaging.

A stub is commonly known as a routed connection which deviates from the primary path of a signal line. Stubs are often created by leads and other packaging connections that to couple a conventional IC device to signal lines on a printed circuit board. Stubs which are too long may have adverse affects on a signal line, creating unwanted signal reflections. According to the present invention, the flow through approach alleviates the stub problem created by conventional packaging I/O structures, such as leads. Indeed, the minimum interconnect is disposed between the signal line of the bus and the bond pad of the integrated circuit device.

In another embodiment a first, multi-chip device 800 (FIG. 7A or 7B) may be coupled in series with a second multi-chip device 400 (FIG. 3A and/or FIG. 3B). This configuration benefits from an on-chip or integrated resistor terminating the end of each signal line of the bus. Thus, no external resistor is required in this approach.

Figure 8:
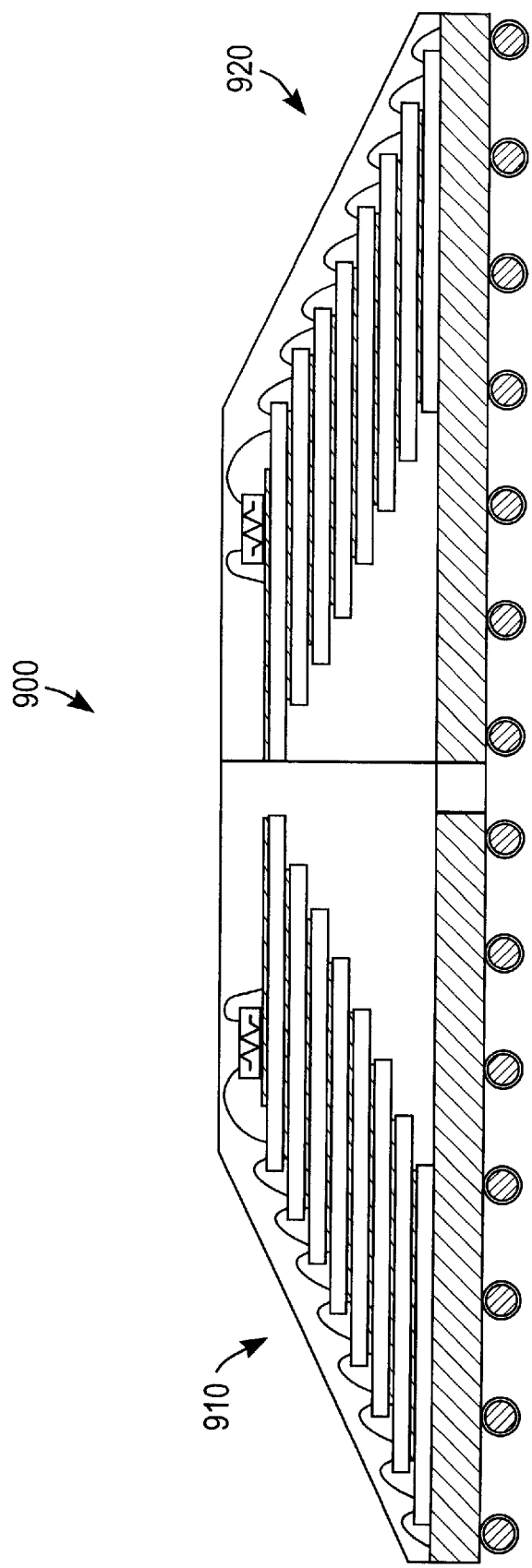

Several resistor terminated stacks, such as the resistor terminated stacks 910 and 920 shown in FIG. 8 may be incorporated into a multi-chip device 900 and employed in, for example, a memory system that utilizes two independently operated busses. Here each bus may be coupled to a respective resistor terminated stack 910 or 920. Although, resistor terminated stacks 910 and 920 are the same as those shown in multi-chip device 400 in FIG. 3A, any stack configuration may be employed, such as those shown in FIG. 3B, and/or multi-chip device 800 from FIGS. 7A and 7B. Moreover, additional stacks may be incorporated into multi-chip device 900 depending on the number of independent busses employed in the memory system. For example, four stacks may be employed in a system configured with four independently operated busses.

Figure 9:
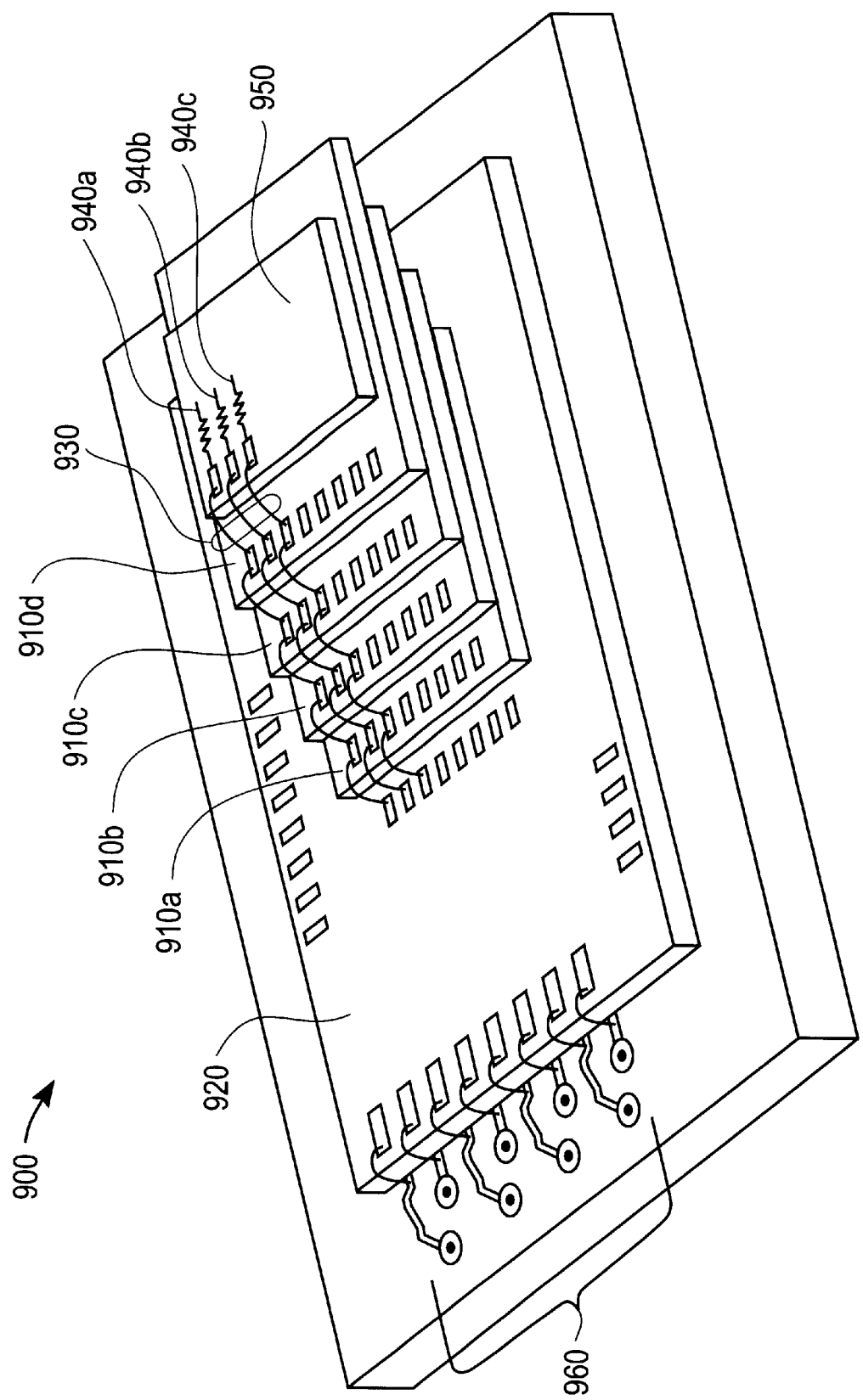

According to the present invention the plurality of IC die may comprise one or more types of IC devices for example, a plurality of memory die, a controller die and memory die, or a processor, controller and plurality of memory die. With reference to FIG. 9, a diagram representing a multi-chip device in accordance to another embodiment of the present invention is illustrated. In this embodiment multi-chip device 900 includes a plurality of stacked memory devices 910*a*–910*d*, and controller 920. Bus 930 comprising a plurality of controlled impedance multi-drop transmission lines (only three are shown for simplicity) couples memory devices 910*a*–910*d* to controller 920 and is bound "on-device". In this embodiment, resistor terminators 940*a*–940*c* are disposed on device 950 to terminate respective transmission lines of bus 930. A plurality of via connections 960 couple pads on the controller 920 to external leads or solder balls (not shown).

Figure 10:
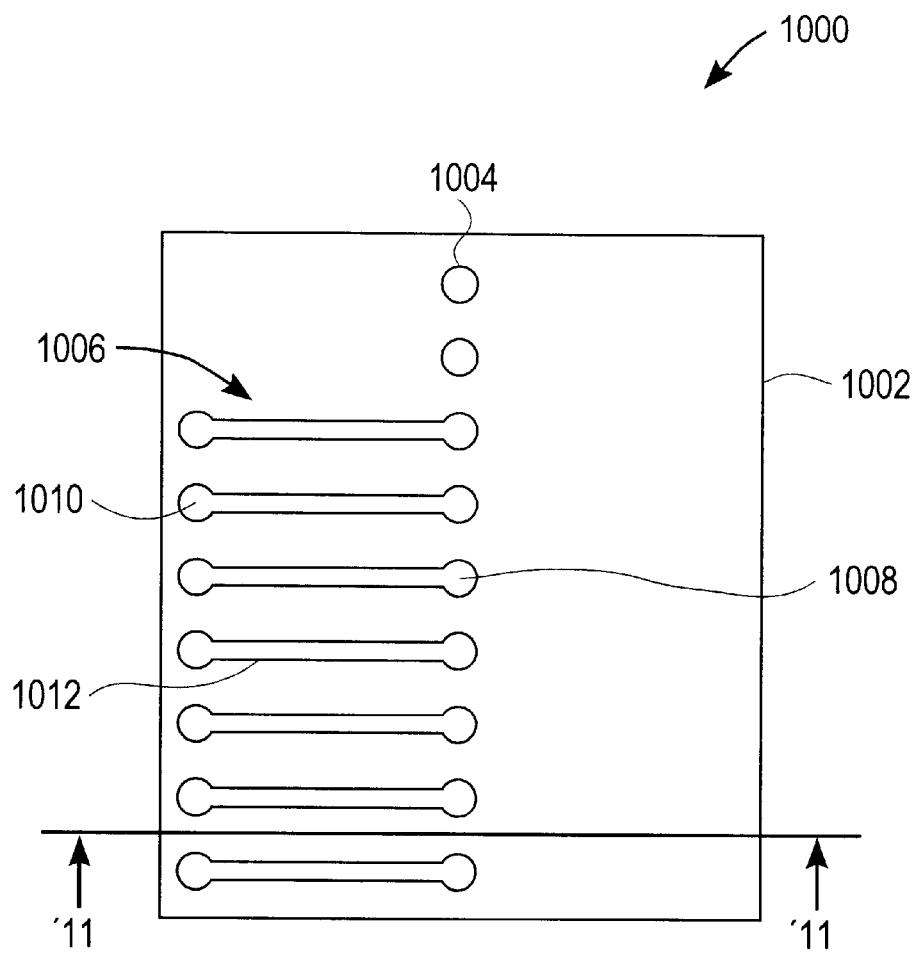
FIG. 10 is a top view of an integrated circuit die according to an embodiment of the invention.

FIG. 10 is a top view of an IC die 1000 according to an embodiment of the invention. Nowadays, many IC dice are constructed with conductive pads or bond pads located along a line near the center of the IC die 1000 (central conductive pad), as depicted by reference numeral 1004. The placement of these central conductive pads, however, excludes these types of IC dice from being stacked one above another, as described above in relation to FIGS. 3, and 7 to 9. This is because the conductive pads of an IC die stacked beneath another IC die prevent the central conductive pads on the lower IC die from being connected to the conductive pads on the upper IC die.

Figure 11:
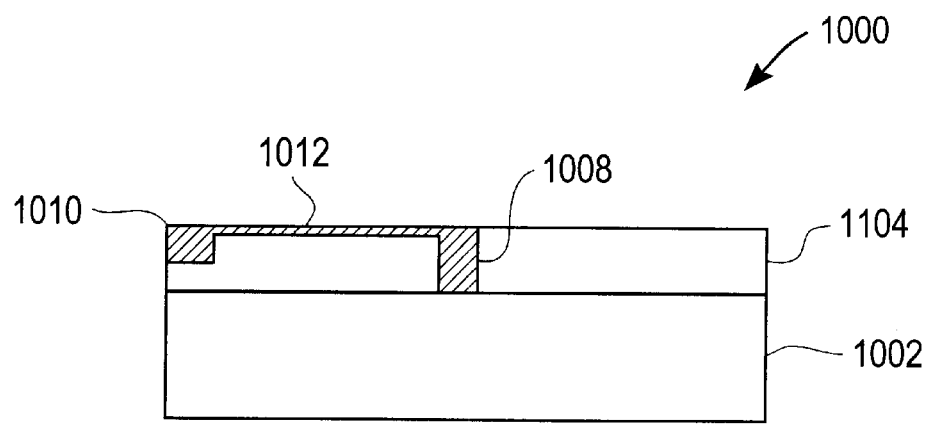
FIG. 11 is a cross sectional view along the line '11—'11 of the integrated circuit die shown in FIG. 10.
Figure 12:
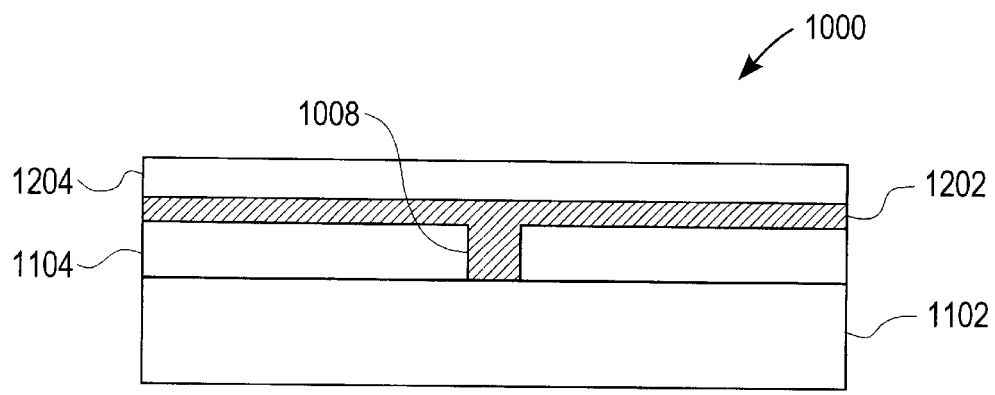
FIG. 12 is a cross sectional view along the line '11—'11 of the integrated circuit die shown in FIG. 10, as depicted during the manufacture of the IC die.

To address this problem, the central conductive pads are redistributed from the center of the IC die towards the peripheral edge of the die. This is preferably undertaken by forming redistributed conductive pads near the peripheral edge of the die and electrically connecting the central conductive pads to these redistributed conductive pads. It should, however, be noted that the central conductive pads do not have to be formed along a central line on a planar surface of the die as shown in FIGS. 10 to 12, but may be located anywhere on the IC die other than near the IC dice periphery. Likewise, the redistributed conductive pads may be located near, or preferably at, the periphery edge of the IC die. A small edge is typically necessary due to mechanical requirements when dicing the wafer to produce individual dice. The small edge is usually about 50 microns.

FIG. 11 is a cross sectional view along the line '11—'11 of the IC die shown in FIG. 10. The IC die 1000 preferably comprises a substrate 1002 with an insulative layer 1104, such as a Silicon oxide or a polyimide, thereon. The central conductive pads 1008 are positioned on the substrate 1002, typically along a central line formed on the planar surface of the substrate 1002. Electrical connections 1012, preferably copper traces, electrically connect the central conductive pads to the redistributed conductive pads 1010.

FIG. 12 is a cross sectional view along the line '11—'11 of the IC die shown in FIG. 10, as depicted during the manufacture of the IC die. The preferable means for forming an electrical connection between the original conductive pads 1008 and the redistributed conductive pads (1010 of FIGS. 10 and 11) will now be described. A conductive layer 1202 is first applied to the upper surface of the insulator 1104. This is preferably done by a copper sputtering process. A resist layer 1204 is then applied to the IC die above the conductive layer 1202. Using a masking process, the resist layer 1204 is removed from the IC die at all locations except where the desired traces (1012 of FIG. 10) and redistributed conductive pads (1010 of FIG. 10) are located. Using an etching process, preferably chemical etching, the conductive layer 1202 is removed from the IC die at all locations except where the remaining portions of the resist layer are to be formed. Finally, a second process, preferably a chemical process, removes the remaining portions of the resist layer, thereby exposing the traces (1012 of FIG. 10) and redistributed conductive pads (1010 of FIG. 10). A person of ordinary skill in the art of semiconductor manufacturing will appreciate that any other suitable means of connecting the centrally located conductive pads to the redistributed conductive pads may be utilized. Such a process may occur at a central IC die fabrication plant or at a later time, such as at a packaging facility.

Figure 13:
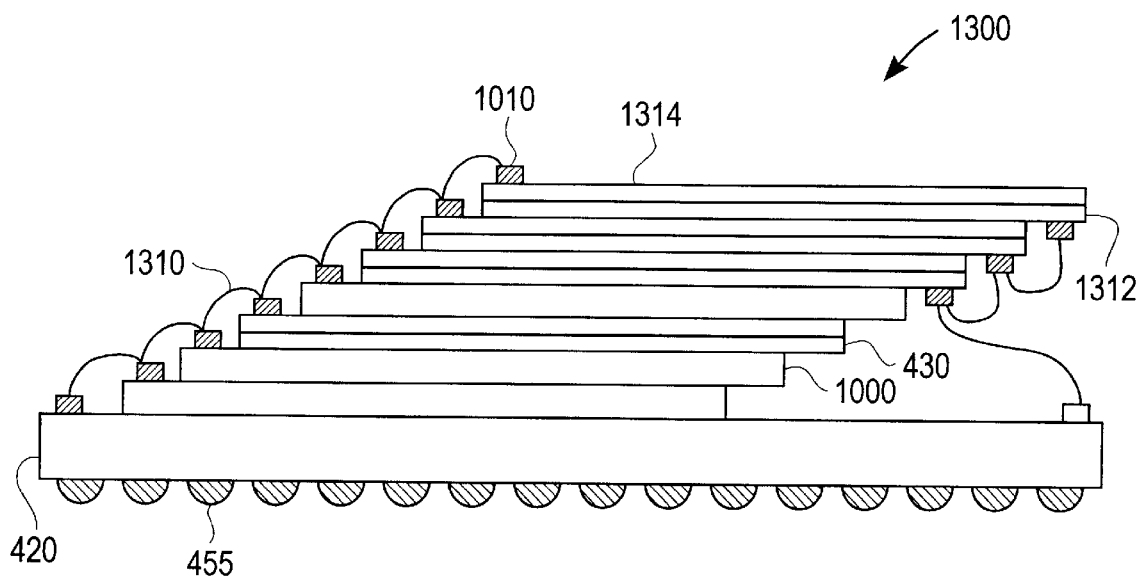
FIG. 13 is a side view of a semiconductor module according to an embodiment of the invention.

FIG. 13 is a side view of a semiconductor module 1300 according to an embodiment of the invention. Once the original conductive pads (1008 of FIGS. 10 to 12) of the IC dice 1000 have been redistributed to the redistributed conductive pads 1010, the IC dice are stacked one on top of the other in a staircase-like manner. The redistributed conductive pads 1010 are electrically interconnected using bond wires 1310, in the same manner as previously described. Back to back IC dice 1314 and 1312 may also be connected as described in relation to FIG. 3D. Likewise, spacers 430 may be placed between IC dice, as discussed in relation to FIG. 3A.

Figure 14:
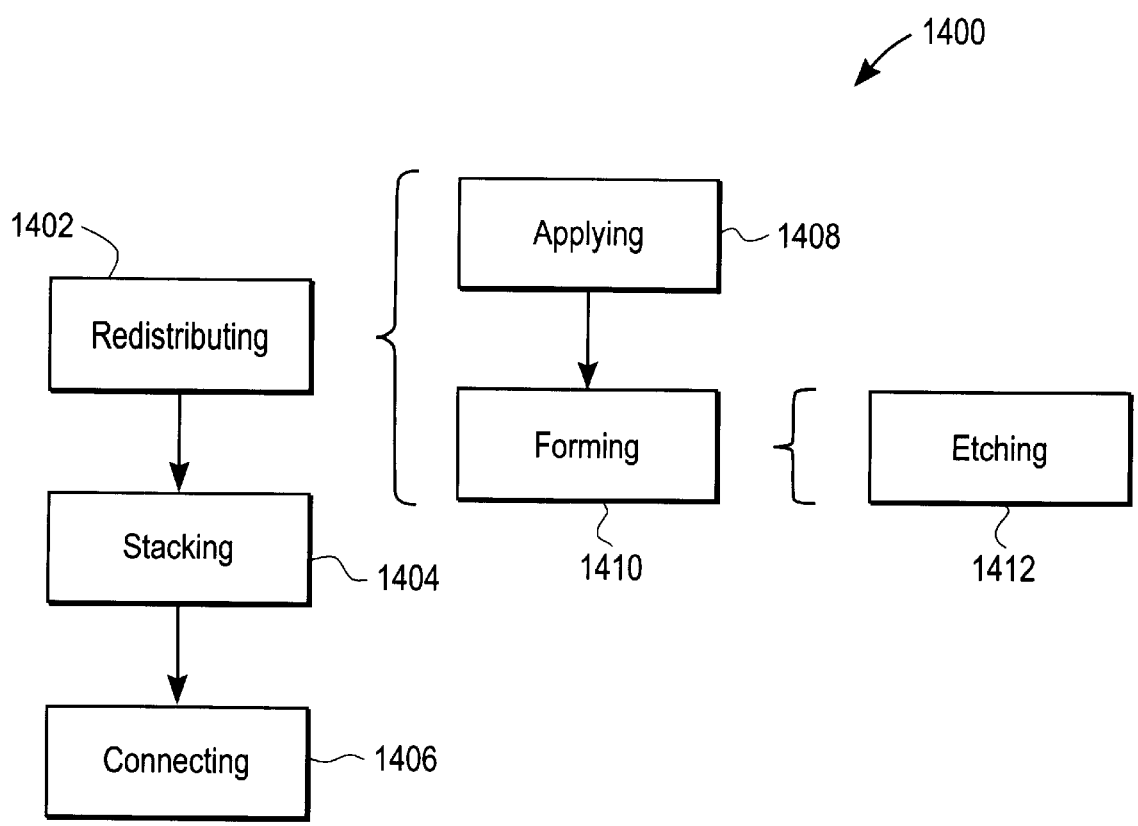
FIG. 14 is a flow chart of a method of making a semiconductor module from existing integrated circuit dice.

FIG. 14 is a flowchart of a method 1400 of making a semiconductor module from existing IC dice. First, a central conductive pad is redistributed (step 1402) to a redistributed conductive pad disposed near a periphery edge of a first IC die. As explained above in relation to FIG. 12, the redistribution (step 1402) of the central conductive pad may be undertaken by applying (step 1408) a conductive layer to the planar surface of the first IC die and forming (step 1410) a redistributed conductive pad and a trace from the conductive layer, where the trace joins the first conductive pad and the redistributed conductive pad. The forming (step 1410) of the redistributed conductive pad and the trace is preferably done by a chemical etching process (step 1412).

A second IC die may then be stacked (step 1404) adjacent to and offset from the periphery of the planar surface of the first IC die in a staircase-like manner. Finally, a second conductive pad on said second IC die is electrically connected (step 1406) to the redistributed conductive pad.

Moreover, the above semiconductor module is especially well suited to memory applications, such as DRAM. These semiconductor or memory modules connect to an external transmission line (460 of FIG. 3B) or channel within a computing device, via connectors (455 of FIG. 13) on the memory module. The connectors connect to a bus that connects the conductive bond pads on the IC dice to one another using bond wires (1310 of FIG. 13). Typically, the IC dice within these memory modules connect to a plurality of common signals, such as a common voltage supply, a reference voltage, an electrical ground, combination signals, or address signals. Connection to the common signals allows for shared connectors (455 of FIG. 13), which reduces both the overall number of bond wires needed in the memory module, as well as the footprint of the memory module. Furthermore, in specific applications, the channel can be terminated internal to the memory module, such as by a termination resistor, as shown in FIGS. 3A, 3B, and 3D.

While this invention has been described in connection with what is presently considered to be the most practical embodiments, it is to be understood that the invention is not limited to the disclosed embodiments. In this regard, one of ordinary skill in the art might readily recognize that the multi-chip device in accordance to the present invention may comprise various configurations in which a plurality of IC devices are disposed along a multi-drop transmission line and positioned on a base and/or housed inside an IC package. The multi-drop transmission line may be terminated at one or two ends or may be implemented in a flow-through approach. Indeed, the embodiments disclosed cover various modifications that are within the scope of the invention as defined in the following claims.

What is claimed is:

1. A method of making a semiconductor module from existing integrated circuit dice, comprising:
   redistributing a first conductive pad disposed substantially on a planar surface of a first integrated circuit die from a position substantially along a median line of said planar surface to a redistributed conductive pad disposed near a periphery of said planar surface;
   stacking a second integrated circuit die adjacent to said planar surface and offset from said periphery; and
   electrically connecting a second conductive pad on said second integrated circuit die to said redistributed conductive pad.

2. The method of making a semiconductor module of claim 1, wherein said redistributing comprises:
   applying a conductive layer to said planar surface of said first integrated circuit die; and
   forming a redistributed conductive pad and a conductive trace from said conductive layer, where said conductive trace electrically connects said first conductive pad and said redistributed conductive pad.

3. The method of making a semiconductor module of claim 2, wherein said forming comprises etching said redistributed conductive pad and said conductive trace.

4. The method of making a semiconductor module of claim 2, wherein said applying comprises sputtering a conductive substance onto said planar surface of said first integrated circuit die.

5. The method of making a semiconductor module of claim 2, wherein said applying comprises sputtering copper onto said planar surface of said first integrated circuit die.

6. The method of making a semiconductor module of claim 1, further comprising, prior to said redistributing:
   providing said first integrated circuit die having said planar surface;
   forming an insulative layer on said planar surface, where said insulative layer has an insulative layer planar surface;
   creating said first conductive pad on said insulative layer planar surface;
   fabricating said redistributed conductive pad on said insulative layer planar surface; and
   electrically connecting said redistributed conductive pad to said first conductive pad.

7. The method of making a semi conductor module of claim 1, further comprising repeating said redistributing and said electrically connecting for each of multiple conductive pads located on said first integrated circuit die.

8. The method of making a semiconductor module of claim 1, wherein said stacking occurs in a staircase-like manner.

9. The method of making a semiconductor module of claim 1, further comprising, before said stacking, positioning a spacer between said first integrated die and said second integrated die.

10. The method of making a semiconductor module of claim 1, further comprising electrically connecting said redistributed conductive pad and said second conductive pad to a common electrical source, where said common slectrical source is selected from a group consisting of: a signal input, a signal output, a voltage supply, a reference voltage, an electrical ground, a combination signal input, an address signal input, and a terminator.

11. The method of making a semiconductor module of claim 1, further comprising, before said redistributing, relocating a third conductive pad disposed substantially on a second die planar surface of said second integrated circuit die from a position substantially along a median line of said second die planar surface to said second conductive pad disposed near a periphery of said second die planar surface.

12. The method of making a semiconductor module of claim 1, further comprising electrically connecting said redistributed conductive pad and said second conductive pad to a termination resistor internal to said semiconductor module.

13. The method of making a semiconductor module of claim 1, further comprising, prior to said redistributing, providing said first integrated circuit die having an insulative layer on said planar surface.

14. The method of making a semiconductor module of claim 13, wherein said redistributing comprises:
   sputtering a conductive substance onto said insulative layer to form a conductive planar surface;
   applying a resist layer to said conductive planar surface;
   masking said resist layer, such that said first conductive pad, said redistributed conductive pad, and a trace connecting said redistributed conductive pad to said first conductive pad, are masked.
   removing said resist layer, except where masked;
   etching said conductive planar surface to remove said conductive substance, at all locations, except where said resist layer is formed;

clearing the remaining resist layer to expose said first contact pad, said redistributed conductive pad, and said trace connecting said redistributed conductive pad to said first conductive pad.

15. The method of making a semiconductor module of claim 14, wherein said etching occurs via a chemical process.

16. The method of making a semiconductor module of claim 14, wherein said clearing occurs via a chemical process.

17. A method of making a semiconductor module from existing integrated circuit dice, comprising:

providing a first integrated circuit die having an insulative layer planar surface, and having a first conductive pad disposed substantially on said insulative layer planar surface and disposed substantially along a median line of said insulative layer planar surface;

sputtering a conductive substance onto said insulative layer planar surface to form a conductive planar surface;

applying a resist layer to said conductive planar surface;

masking said resist layer, such that said first contact pad, a redistributed conductive pad disposed near a periphery of said first integrated circuit die, and a trace connecting said redistributed conductive pad to said first conductive pad, are masked;

removing said resist layer, except where masked;

etching said conductive planar surface to remove said conductive substance, at all locations except where said resist layer is formed;

clearing the remaining resist layer to expose said first contact pad, said redistributed pad, and said trace connecting said redistributed conductive pad to said first conductive pad;

stacking a second integrated circuit die adjacent to said first integrated circuit die and offset from said periphery; and electrically connecting a second conductive pad on said second integrated circuit die to said redistributed conductive pad.

18. The method of making a semiconductor module of claim 17, further comprising, before said providing, relocating a third conductive pad disposed substantially on a second die planar surface of said second integrated circuit die from a position substantially along a median line of said second die planar surface to said second conductive pad disposed near a periphery of said second die planar surface.

* * * * *